US012693077B2

(12) United States Patent
Jeong et al.

(10) Patent No.: US 12,693,077 B2
(45) Date of Patent: Jul. 28, 2026

(54) VAPOR CHAMBER AND DISPLAY DEVICE INCLUDING THE SAME

(71) Applicant: Samsung Display Co., LTD., Yongin-si (KR)

(72) Inventors: Wee Joon Jeong, Yongin-si (KR); Yong Il Kim, Yongin-si (KR); Byoung Kyoo Park, Yongin-si (KR); Jang Un Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 308 days.

(21) Appl. No.: 18/355,528

(22) Filed: Jul. 20, 2023

(65) Prior Publication Data

US 2024/0118036 A1 Apr. 11, 2024

(30) Foreign Application Priority Data

Oct. 7, 2022 (KR) ........................ 10-2022-0128556
Mar. 30, 2023 (KR) ........................ 10-2023-0041665

(51) Int. Cl.
*H05K 7/20* (2006.01)
*F28D 15/02* (2006.01)
*F28D 15/04* (2006.01)

(52) U.S. Cl.
CPC ......... *F28D 15/0233* (2013.01); *F28D 15/04* (2013.01); *H05K 7/20336* (2013.01)

(58) Field of Classification Search
CPC .. F28D 15/0233; F28D 15/04; H05K 7/20336
USPC ........................................................ 361/700
See application file for complete search history.

(56) References Cited

U.S. PATENT DOCUMENTS

| | | | | |
|---|---|---|---|---|
| 7,352,582 B2* | 4/2008 | Yokoyama | ........... | H10K 59/871 |
| | | | | 361/679.48 |
| 10,485,147 B2* | 11/2019 | Oh | ........... | H05K 7/2099 |
| 2005/0117295 A1* | 6/2005 | Patel | ........... | H05K 7/20 |
| | | | | 361/697 |
| 2005/0168947 A1* | 8/2005 | Mok | ........... | H01L 23/427 |
| | | | | 361/698 |
| 2006/0037737 A1* | 2/2006 | Chen | ........... | F28D 15/0233 |
| | | | | 257/E23.088 |
| 2009/0009974 A1* | 1/2009 | Tseng | ........... | G02F 1/133382 |
| | | | | 361/711 |
| 2010/0243212 A1* | 9/2010 | Meyer, IV | ........... | F28D 15/04 |
| | | | | 165/104.26 |

(Continued)

FOREIGN PATENT DOCUMENTS

| | | |
|---|---|---|
| KR | 10-1402625 | 6/2014 |
| KR | 10-2015-0091905 | 8/2015 |

(Continued)

OTHER PUBLICATIONS

WO 2021157506 A1_English_Translation (Year: 2021).*

*Primary Examiner* — Anatoly Vortman
(74) *Attorney, Agent, or Firm* — Sughrue Mion, PLLC

(57) ABSTRACT

A vapor chamber comprises a front surface member having a curvature, a rear surface member coupled to the front surface member, a wick disposed between the front surface member and the rear surface member, and a refrigerant at least partially filled between the front surface member and the rear surface member, wherein the rear surface member includes a plurality of bent areas.

15 Claims, 23 Drawing Sheets

(56)     References Cited

U.S. PATENT DOCUMENTS

| 2014/0083653 A1* | 3/2014 | Kempers | F28D 15/046 |
| | | | 165/104.21 |
| 2014/0182820 A1* | 7/2014 | Chen | F28D 15/04 |
| | | | 165/104.26 |
| 2015/0212558 A1* | 7/2015 | Lin | G06F 1/203 |
| | | | 361/699 |
| 2015/0286088 A1* | 10/2015 | Kim | G02B 6/0031 |
| | | | 312/223.1 |
| 2015/0346784 A1* | 12/2015 | Delano | F28D 15/0233 |
| | | | 361/679.53 |
| 2016/0278238 A1 | 9/2016 | Yu et al. | |
| 2018/0263138 A1 | 9/2018 | Wu et al. | |
| 2019/0182970 A1* | 6/2019 | Jeong | G02F 1/133602 |
| 2021/0364238 A1* | 11/2021 | Wang | F28D 15/0233 |
| 2023/0171924 A1* | 6/2023 | Huang | H01L 23/427 |
| | | | 361/700 |
| 2023/0349644 A1* | 11/2023 | Lin | F28D 15/0275 |
| 2024/0188242 A1* | 6/2024 | Jung | H05K 5/03 |

FOREIGN PATENT DOCUMENTS

| KR | 10-2021-0036289 | 4/2021 |
| KR | 10-2390901 | 4/2022 |
| TW | M627237 | 5/2022 |
| WO | 2021/157506 | 8/2021 |

* cited by examiner

NDA : NDA1, NDA2, NDA3, NDA4

FIG. 6

EXM : 210, 220, 230, 240, 250, 260

RFG

WCK

210

DR2
DR1
DR3

220     240

210     WCK

DR2
DR1
DR3

EXM : 210, 220, 230, 240, 250, 260

VAPOR CHAMBER AND DISPLAY DEVICE INCLUDING THE SAME

CROSS-REFERENCE TO RELATED APPLICATION

This application claims priority to and benefits of Korean Patent Application No. 10-2022-0128556 filed on Oct. 7, 2022 and 10-2023-0041665 filed on Mar. 30, 2023 in the Korean Intellectual Property Office, the entire contents of which are incorporated herein by reference.

BACKGROUND

1. Technical Field

The disclosure relates to a vapor chamber capable of effectively dissipating heat generated from a display panel and a display device including the vapor chamber.

2. Description of the Related Art

The importance of display devices as a communication media, has been emphasized because of the increasing developments of information technology. For example, display devices have been applied to various electronic devices such as smartphones, digital cameras, laptop computers, navigation devices, smart televisions, or the like. The display devices may be flat panel display devices such as liquid crystal display devices, field emission display devices, organic light emitting display devices, or the like.

A display device may include a heat dissipation member that efficiently dissipates heat generated when the display panel emits light. The display device may include a vapor chamber including a refrigerant material such as a phase change material (PCM), which serves as a heat dissipation member.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a vapor chamber capable of effectively dissipating heat generated from a display panel.

Embodiments also provide a display device including the vapor chamber.

However, embodiments of the disclosure are not limited to those set forth herein. The above and other aspects embodiments will become more apparent to one of ordinary skill in the art to which the disclosure pertains by referencing the detailed description of the disclosure given below.

According to an aspect of the disclosure, a vapor chamber comprises a front surface member having a curvature, a rear surface member coupled to the front surface member, a wick disposed between the front surface member and the rear surface member, and a refrigerant at least partially filled between the front surface member and the rear surface member. The rear surface member includes a plurality of bent areas.

In an embodiment, the rear surface member may include a first area, a second area bent from the first area, and a third area bent from the first area. The first area may be disposed between the second area and the third area. Each of the first area, the second area, and the third area may be formed as a flat surface.

In an embodiment, the second area may extend from a side of the first area and is connected to the front surface member. The third area may extend from another side of the first area and is connected to the front surface member. Each of the second area and the third area may be bent in a direction toward the front surface member.

In an embodiment, the rear surface member may further include a first boundary line along which the second area is bent and a second boundary line along which the third area is bent. The first boundary line may be disposed between the first area and the second area. The second boundary line may be disposed between the first area and the third area. The first boundary line and the second boundary line may be parallel to each other.

In an embodiment, the first boundary line may be disposed between about ⅕ and about ⅓ of a length of the rear surface member in a direction from a side of the rear surface member in a plan view. The second boundary line may be disposed between about ⅕ and about ⅓ of a length of the rear surface member in another direction from another side of the rear surface member in a plan view.

In an embodiment, an interval between the front surface member and the rear surface member at the first boundary line may be the same as an interval between the front surface member and the rear surface member at the second boundary line.

In an embodiment, in the second area, an interval between the front surface member and the rear surface member may gradually decrease as a distance from the first area increases. In the third area, an interval between the front surface member and the rear surface member may gradually decrease as a distance from the first area increases.

In an embodiment, the wick may be disposed on an inner side surface of the front surface member facing the rear surface member.

In an embodiment, the rear surface member may include a plurality of recessed parts recessed toward the front surface member.

In an embodiment, the rear surface member may further include a first boundary line along which the second area is bent and a second boundary line along which the third area is bent. The first boundary line may be disposed between the first area and the second area. The second boundary line may be disposed between the first area and the third area. The plurality of recessed parts may include first recessed parts adjacent to the first boundary line and the second boundary line and second recessed parts spaced apart from the first recessed parts.

In an embodiment, a diameter of the first recessed parts may be greater than a diameter of the second recessed parts.

In an embodiment, an interval between the plurality of recessed parts may gradually increase in an area between the first boundary line and a center of the rear surface member and decrease in an area between the second boundary line and the center of the rear surface member.

According to an aspect of the disclosure, a vapor chamber comprises a front surface member, a rear surface member coupled to the front surface member and having a curvature, a wick disposed between the front surface member and the rear surface member, and a refrigerant at least partially filled between the front surface member and the rear surface member. An interval between the front surface member and the rear surface member gradually decreases from a center of the rear surface member in a direction and another direction.

In an embodiment, the front surface member may be formed as a flat surface or a curved surface.

In an embodiment, the front surface member may be formed as a curved surface having a curvature, and a radius of curvature of the rear surface member may be smaller than a radius of curvature of the front surface member.

In an embodiment, the wick may be disposed on an inner side surface of the front surface member facing the rear surface member.

According to an aspect of the disclosure, a display device comprises a display panel, and a vapor chamber disposed on a rear surface of the display panel. The vapor chamber includes a front surface member in contact with the display panel and having a curvature, a rear surface member coupled to the front surface member, a wick disposed between the front surface member and the rear surface member, and a refrigerant at least partially filled between the front surface member and the rear surface member, and the rear surface member includes a plurality of bent areas.

In an embodiment, the wick may be disposed on an inner side surface of the front surface member facing the rear surface member.

In an embodiment, the rear surface member may include a plurality of recessed parts recessed toward the front surface member.

In an embodiment, the display panel may have a curved surface following the curvature of the front surface member.

A vapor chamber and a display device including the vapor chamber according to an embodiment may include a wick and a refrigerant inside the vapor chamber and dissipate heat generated from a display panel. The vapor chamber and the display device including the vapor chamber according to an embodiment may include an interval between a front surface member and a rear surface member of the vapor chamber in an area in which heat generation is great in the display panel and increase a volume of the refrigerant embedded in the vapor chamber. Thus, the heat of the display panel may be effectively dissipated.

The effects of the disclosure are not limited to the aforementioned effects, and various other effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 6 is a schematic perspective view illustrating a vapor chamber according to an embodiment;

FIG. 11 is a schematic cross-sectional view of the vapor chamber according to an embodiment;

DETAILED DESCRIPTION OF THE EMBODIMENTS

Figure 1:
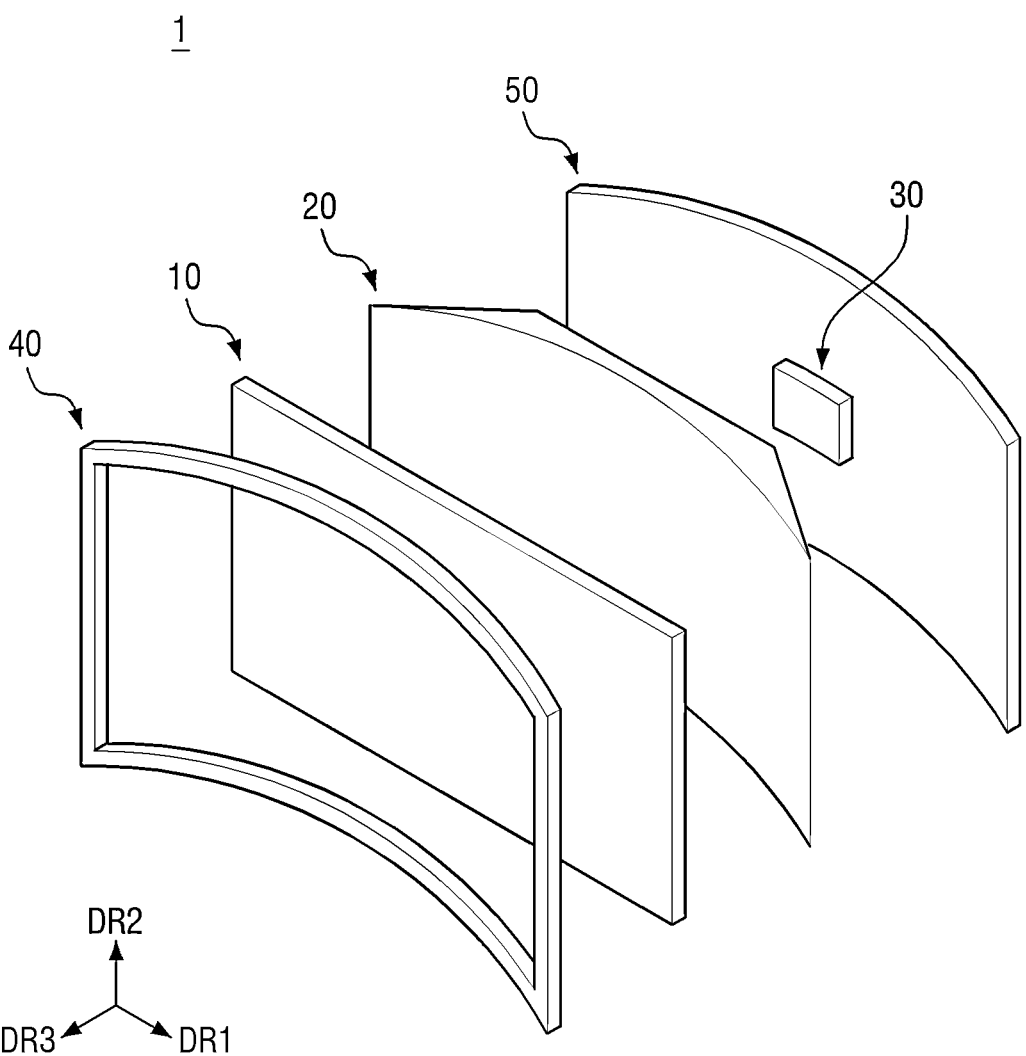
FIG. 1 is a schematic exploded perspective view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. It may also be understood that if one part and another part are connected, they may or may not be integral with each other.

Although the terms "first," "second," etc. may be used herein to describe various elements, these elements should not be limited by these terms. These terms are only used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments are described with reference to the accompanying drawings.

FIG. 1 is a schematic exploded perspective view of a display device according to an embodiment.

Referring to FIG. 1, a display device 1 according to an embodiment may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, vehicle navigation systems, vehicle instrument boards, digital cameras, camcorders, external billboards, electric signs, medical devices, inspection devices, various home appliances such as refrigerators and washing machines, Internet of Things (IoT) devices, or the like. In the disclosure, a television (TV) may be described as an example of the display device, and the TV may have high resolution or ultra-high resolution such as high definition (HD), ultra-high definition (UHD), 4K, 8K, or the like.

The display device 1 according to an embodiment may be variously classified according to a display method. For example, the display devices may be classified into an organic light emitting display (OLED), an inorganic light emitting display (inorganic EL), a quantum dot light emitting display (QED), a micro LED display (micro-LED), a nano LED display (nano-LED), a plasma display panel (PDP), a field emission display (FED), a cathode ray tube display (CRT), a liquid crystal display (LCD), an electrophoretic display (EPD), and the like. Hereinafter, an organic light emitting display device is described as an example of the display device, and unless a special distinction is required, an organic light emitting display device applied to an embodiment is simply abbreviated as a display device. However, an embodiment is not limited to the organic light emitting display device, and other display devices listed above may also be applied within the scope of the technical idea.

The display device 1 may include a display panel 10, a vapor chamber 20, a driving board 30, a front cover 40, and a rear cover 50.

The display panel 10 may be a self-light emitting display panel. The display panel 10 may be an organic light emitting display panel as the self-light emitting display panel. However, the disclosure is not limited thereto, and other types of display panels such as a liquid crystal display panel, a quantum dot organic light emitting display panel, a quantum dot liquid crystal display, a quantum nano light emitting display panel, and a micro LED may also be applied.

The display panel 10 may include a substrate SUB (e.g., refer to FIG. 4) and a display layer DU (e.g., refer to FIG. 4) disposed on the substrate SUB. A detailed structure of the display panel 10 is described later with reference to FIG. 4 and the like.

The vapor chamber 20 may be disposed on a rear surface of the display panel 10. The vapor chamber 20 may dissipate heat generated from the display panel 10 and the driving board 30 to another space inside the display device 1 or to the outside of the display device 1. For example, the vapor chamber 20 may dissipate the heat generated from the display panel 10 and the driving board 30 to an internal space of the front cover 40 or the rear cover 50 or may dissipate the heat generated from the display panel 10 and the driving board 30 to the outside of the display device 1.

The vapor chamber 20 may be disposed between the display panel 10 and the driving board 30. The vapor chamber 20 is described later with reference to FIG. 6 and the like.

The driving board 30 may include a processor, a memory, and/or an interface. For example, the processor of the driving board 30 may include one or more of a central processing part, an application processor, a graphics processing part, an image signal processor, a sensor hub processor, a communication processor, or the like. In an embodiment, the processor or a communication module may be mounted in an electronic component such as an integrated circuit chip and disposed on the driving board 30.

Electronic components may be disposed on the driving board 30, and some of the electronic components such as the integrated circuit chip in which the processor or the communication module is mounted may generate heat while operating. Heat generated by a heat generating component may degrade operating performance of the heat generating component itself or power efficiency of the display device 1.

The driving board 30 may be positioned on a side opposite to the display panel 10. The vapor chamber 20 may be disposed between the driving board 30 and the display panel 10. In case that the heat is generated from the driving board 30 and directly transmitted to the display panel 10, luminous efficiency of the display panel 10 may be deteriorated and a burn-in phenomenon of an organic material may be generated (or accelerated) in an organic light emitting display panel.

The display device 1 may include a heat dissipation member such as the vapor chamber 20 and quickly disperse or dissipate the heat generated from the driving board 30.

The front cover 40 and the rear cover 50 may be adjacent to (e.g., surround) the display panel 10, the vapor chamber 20, and the driving board 30. The front cover 40 and the rear cover 50 may protect the display panel 10, the vapor chamber 20, and the driving board 30 from external impact.

The front cover 40 may include a highly transmissive material and light emitted from the display panel 10 may pass therethrough. As an example, the front cover 40 may include a polymer resin such as polyimide or glass. In another embodiment, the front cover 40 may include an opening in an area overlapping a display area DPA (e.g., refer to FIG. 2) in a plan view.

A front surface as used herein refers to a surface viewed along a third direction DR3, and a rear surface as used herein refers to a surface viewed along a direction opposite to the third direction DR3. For example, a direction from the display panel 10 toward the driving board 30 in FIG. 1 refers to a direction from the front surface toward the rear surface.

Figure 2:
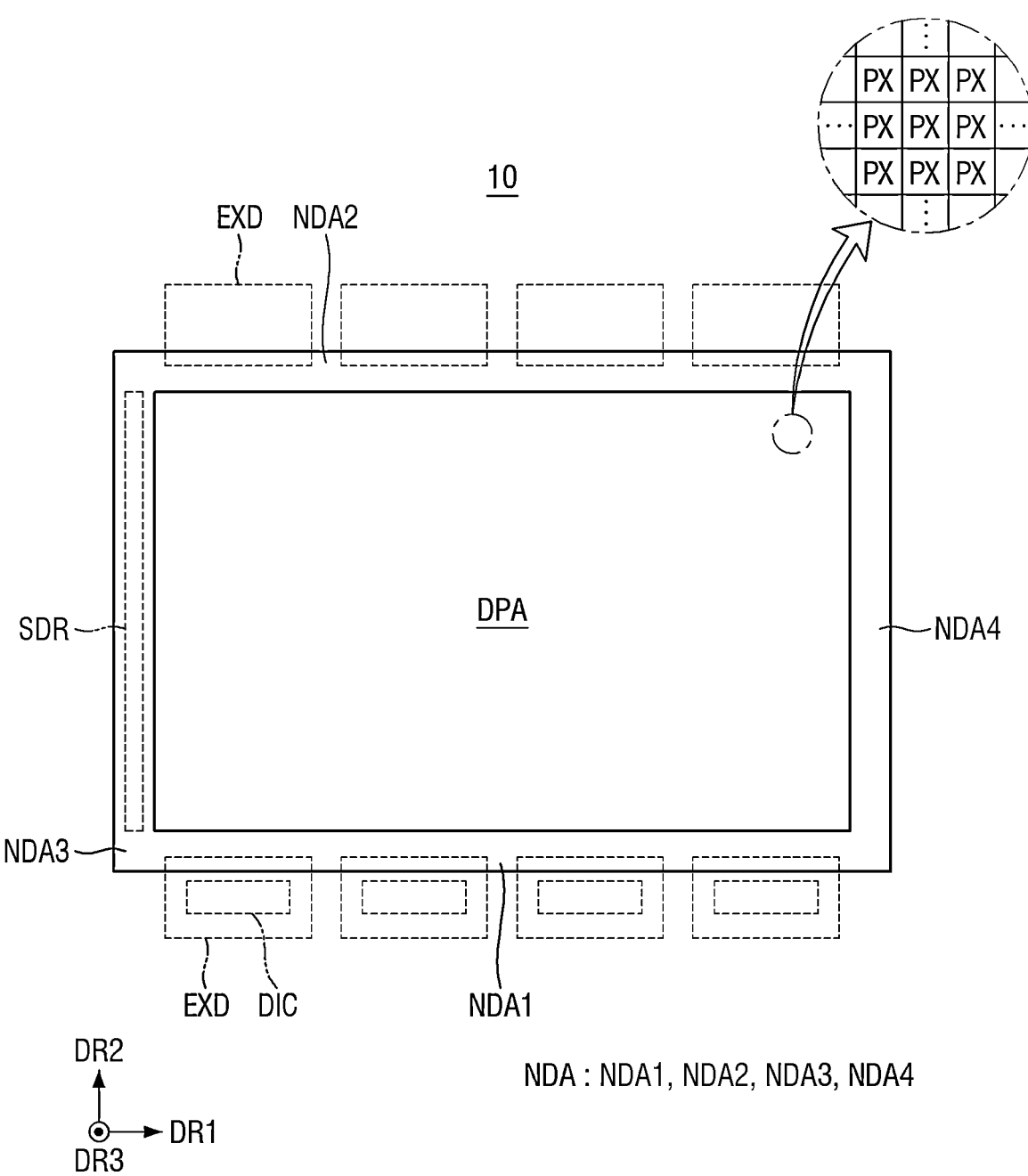
FIG. 2 is a schematic plan view illustrating the display device according to an embodiment.

FIG. 2 is a schematic plan view illustrating the display device according to an embodiment.

Referring to FIG. 2, the display device 1 according to an embodiment may have a square shape in a plan view. For example, the display device 1 may have a rectangular shape, but is not limited thereto.

In some embodiments, when the display device 1 is a television, long sides of the display device 1 may be positioned in a transverse direction (e.g., in the first direction DR1). However, the disclosure is not limited thereto. For example, the long sides of the display device 1 may be positioned in a longitudinal direction (e.g., in the second direction DR2). In other embodiments, the display device 1 may be rotatably installed, and the long sides of the display device 1 may be variably positioned in the transverse or longitudinal direction.

The display device 1 may include a display area DPA and a non-display area NDA. The display area DPA may be an active area in which an image is displayed. The display area DPA may have a rectangular shape in a plan view. The display area DPA may be similar to the overall shape of the display device 1, but is not limited thereto.

The display area DPA may include pixels PX. The pixels PX may be arranged in a matrix direction (or a matrix arrangement). A shape of each pixel PX may be a rectangular shape or a square shape in a plan view, but is not limited thereto. In other embodiments, a shape of each pixel PX may also be a rhombic shape having sides inclined with respect to a side direction of the display device 1. The pixels PX may include several color pixels PX. For example, the pixels PX may include first color pixels PX, second color pixels PX, and third color pixels PX. For example, the first color pixels PX may be red pixels, the second color pixels PX may be green pixels, and the third color pixels PX may be blue pixels, but are not limited thereto. The color pixels PX (e.g., the color pixels PX having different colors) may be alternately arranged in a stripe type or a PenTile™ type.

The non-display area NDA may be disposed adjacent to (e.g., disposed around) the display area DPA. The non-display area NDA may constitute a bezel of the display device 1. The non-display area NDA may entirely or partially surround the display area DPA.

In some embodiments, the display area DPA may have a rectangular shape, and the non-display area NDA may be disposed adjacent to four sides of the display area DPA. For example, the non-display area NDA may include a first non-display area NDA1 disposed adjacent to a first long side (e.g., a lower side in FIG. 2) of the display device 1, a second non-display area NDA2 disposed adjacent to a second long side (e.g., an upper side in FIG. 2) of the display device 1, a third non-display area NDA3 disposed adjacent to a first short side (e.g., a left side in FIG. 2) of the display device 1, and a fourth non-display area NDA4 disposed adjacent to a second short side (e.g., a right side in FIG. 2) of the display device 1.

Driving circuits or driving elements driving the display area DPA may be disposed in the non-display area NDA. As an example, in the first non-display area NDA1 and the second non-display area NDA2, pad parts may be provided on a display substrate of the display device 1, and external devices EXD may be mounted on pad electrodes of the pad parts. The external device EXD may include a circuit member CCM (e.g., refer to FIG. 4) to be described later. Examples of the circuit member CCM may include a connection film, a printed circuit board, a driving chip DIC, a connector, a line connection film, and the like. As another example, a scan driver SDR or the like directly formed on the display substrate of the display device 1 may be disposed in the third non-display area NDA3.

Figure 3:
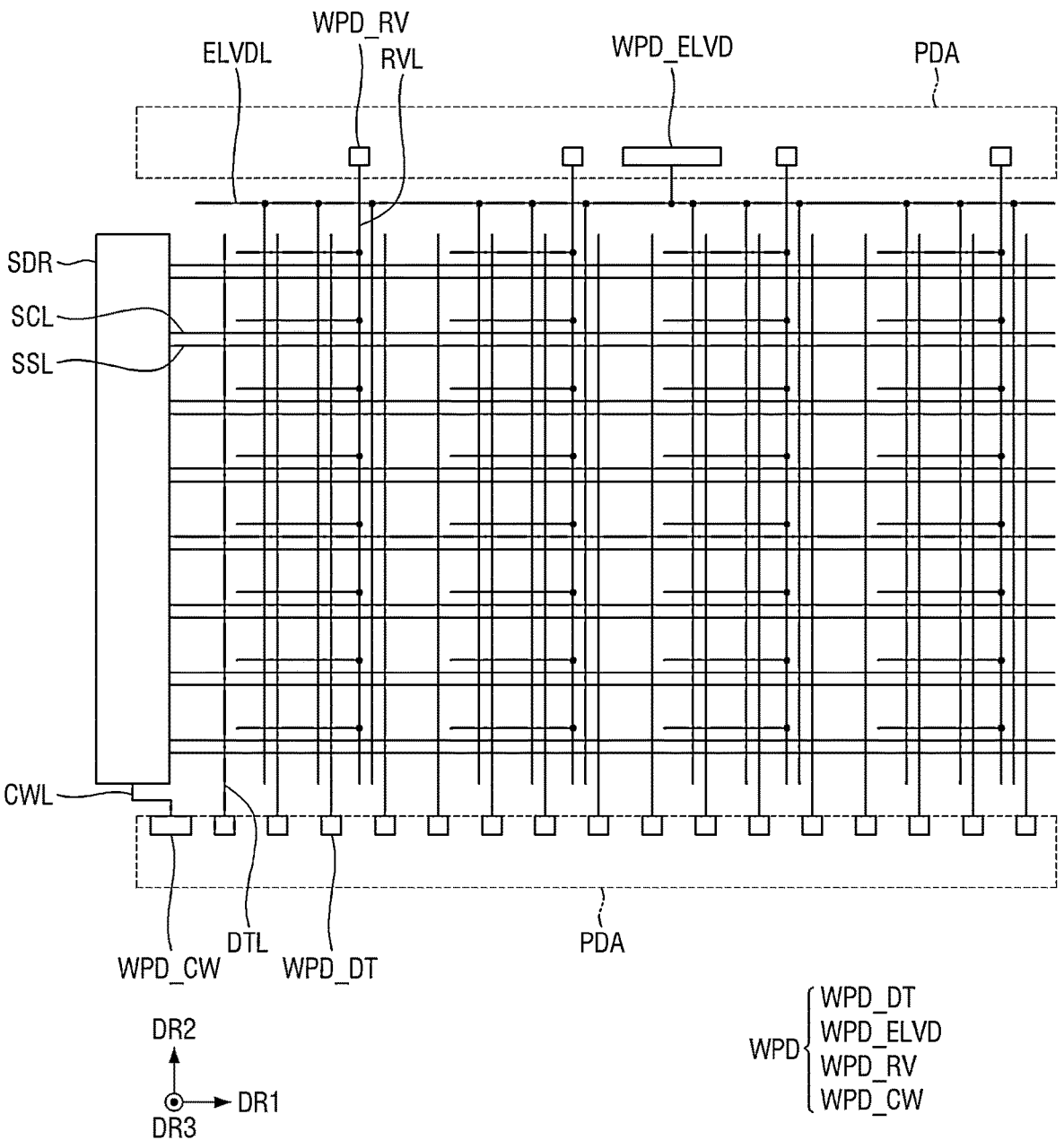
FIG. 3 is a schematic diagram of an equivalent circuit illustrating the display device according to an embodiment.

FIG. 3 is a schematic diagram of an equivalent circuit illustrating the display device according to an embodiment.

Referring to FIG. 3, lines may be disposed on the display substrate of the display device 1. The lines may include scan lines SCL, sensing signal lines SSL, data lines DTL, reference voltage lines RVL, a first power line ELVDL, and the like.

The scan lines SCL and the sensing signal lines SSL may extend in a first direction DR1. The scan lines SCL and the sensing signal lines SSL may be electrically connected to the scan driver SDR. The scan driver SDR may include a driving circuit formed of a circuit layer. The scan driver SDR may be disposed in the third non-display area NDA3 (e.g., refer to FIG. 2), but is not limited thereto. In other embodiments, the scan driver SDR may be disposed in the fourth non-display area NDA4 (e.g., refer to FIG. 2) or be disposed in both the third non-display area NDA3 and the fourth non-display area NDA4. The scan driver SDR may be electrically connected to a signal connection line CWL. For example, a pad WPD_CW may be formed on the first non-display area NDA1 and/or the second non-display area NEA2, and at least one end of the signal connection line CWL may be electrically connected to the external device EXD (e.g., refer to FIG. 2).

In the drawings, the first direction DR1 and the second direction DR2 may be horizontal directions, respectively, and cross (or intersect) each other. For example, the first direction DR1 and the second direction DR2 may be orthogonal to each other. The third direction DR3 may be a perpendicular direction crossing, for example, orthogonal to, the first direction DR1 and the second direction DR2. In the disclosure, directions indicated by arrows of the first to third directions DR1, DR2, and DR3 may be referred to as a side, and directions opposite to a side may be referred to as another side.

The data lines DTL and the reference voltage lines RVL may extend in the second direction DR2 crossing the first direction DR1. The first power line ELVDL may include portions extending in the second direction DR2. The first power line ELVDL may further include portions extending in the first direction DR1. The first power line ELVDL may have a mesh structure, but is not limited thereto.

Wiring pads WPD may be disposed at at least one ends of the data lines DTL, the reference voltage lines RVL, and the first power line ELVDL. Each wiring pad WPD may be disposed in a pad part PDA of the non-display area NDA. In an embodiment, wiring pads WPD_DT (hereinafter, referred to as 'data pads') of the data lines DTL may be disposed in a pad part PDA of the first non-display area NDA1, and wiring pads WPD_RV (hereinafter, referred to as 'reference voltage pads') of the reference voltage lines RVL and a wiring pad WPD_ELVD (hereinafter, referred to as a 'first power pad') of the first power line ELVDL may be disposed in a pad part PDA of the second non-display area NDA2. As another example, all of the data pads WPD_DT, the reference voltage pads WPD_RV, and the first power pad WPD_ELVD may be disposed in a same area (e.g., the first non-display area NDA1). As described above, the external device EXD (e.g., refer to FIG. 1) may be mounted on the wiring pad WPD. The external device EXD may be mounted on the wiring pad WPD through an anisotropic conductive film, ultrasonic bonding, or the like.

Each pixel PX (e.g., refer to FIG. 2) on the display substrate may include a pixel driving circuit. The above-described lines may pass through the respective pixels PX or be disposed around the respective pixels PX, and may apply driving signals to the respective pixel driving circuits. The pixel driving circuit may include a transistor and a capacitor. The numbers of transistors and capacitors in each pixel driving circuit may be variously modified.

Figure 4:
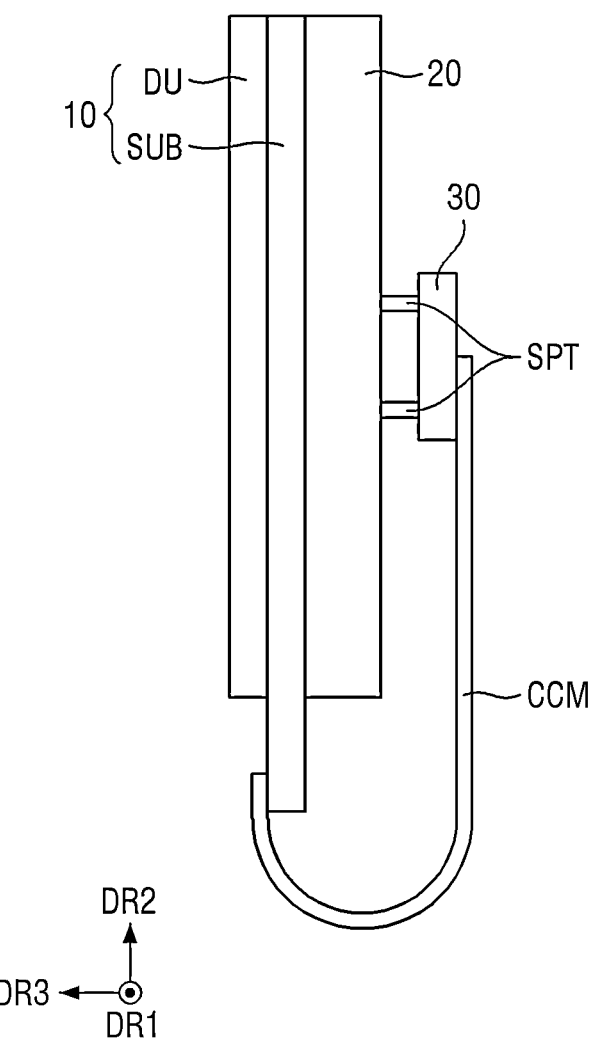
FIG. 4 is a schematic side view illustrating the display device according to an embodiment.
Figure 5:
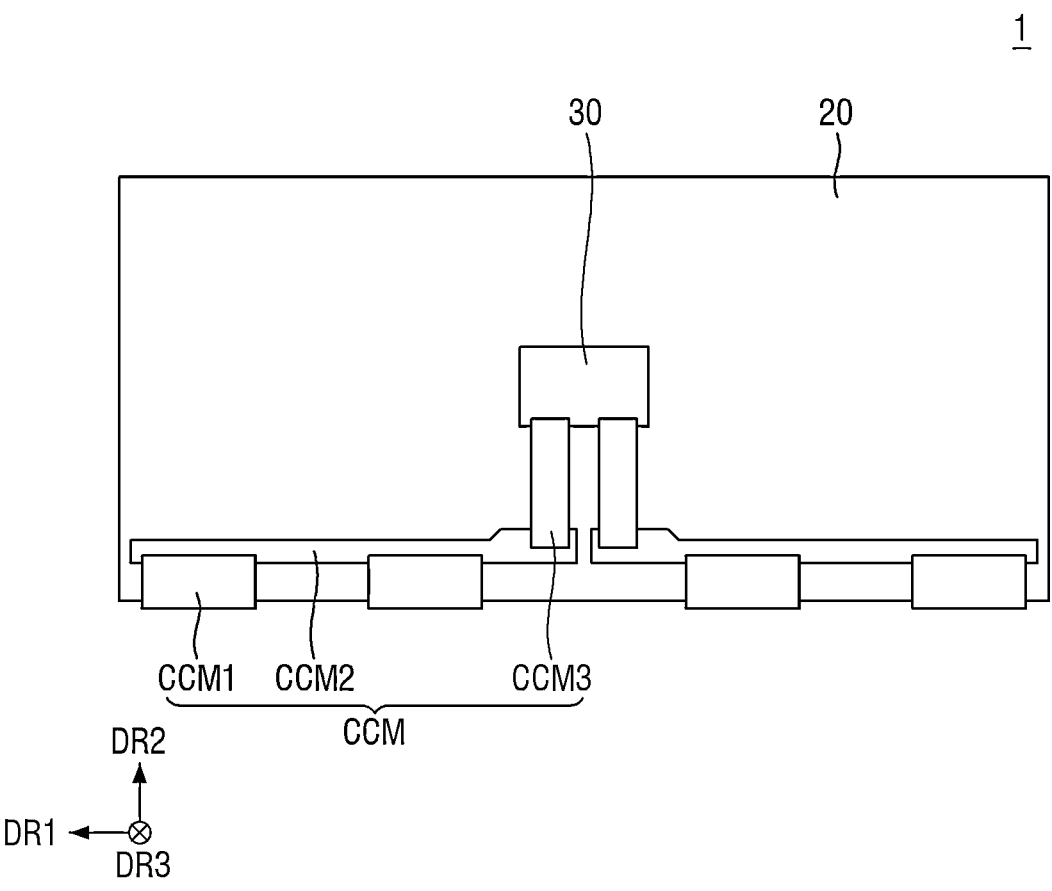
FIG. 5 is a schematic rear view illustrating the display device according to an embodiment.

FIG. 4 is a schematic side view illustrating the display device according to an embodiment. FIG. 5 is a schematic rear view illustrating the display device according to an embodiment.

Referring to FIGS. 4 and 5, the display panel 10 may include a substrate SUB and a display layer DU.

The substrate SUB may be a base substrate or a base member. The substrate SUB may be a flexible substrate that may be bent, folded, and rolled. For example, the substrate SUB may include a polymer resin such as polyimide (PI), but is not limited thereto.

The display layer DU may include a thin film transistor layer (not illustrated), a light emitting element layer (not illustrated), and a thin film encapsulation layer (not illustrated).

The thin film transistor layer may include thin film transistors constituting pixel circuits of the pixels and various lines described in FIG. 2. The light emitting element layer may include light emitting elements each including a first electrode, a light emitting layer, and a second electrode to emit light. The thin film encapsulation layer may cover an upper surface and side surfaces of the light emitting element layer and protect the light emitting element layer. The thin film encapsulation layer may include at least one inorganic film and at least one organic film.

The circuit member CCM may be a connection film, a driving IC chip, a connector, a printed circuit board (PCB), or a flexible printed circuit board (FPCB). In an embodiment, in case that the circuit member CCM is a flexible member, the circuit member CCM may be bent, and at least a portion of the circuit member CCM may face a rear surface of the substrate SUB.

The circuit member CCM may be electrically connected to the substrate SUB through the pad part. In an embodiment, an end of the circuit member CCM may be electrically connected to the substrate SUB, and another end of the circuit member CCM may be electrically connected to the driving board 30. In another embodiment, in case that circuit members CCM are electrically connected to each other, ends (e.g., both ends) of the circuit member CCM may be electrically connected to other circuit members CCM.

In some embodiments, the circuit member CCM may include a first circuit member CCM1, a second circuit member CCM2, and a third circuit member CCM3.

The circuit member CCM may include multiple first circuit members CM1. The first circuit members CM1 may be electrically connected to the substrate SUB and the second circuit member CCM2. In an embodiment, the first circuit member CM1 may be a flexible member and may be any one of a connection film and a flexible circuit board. The first circuit member CM1 may be bent and the second circuit member CCM2, the third circuit member CCM3, and the driving board 30 may be positioned on the rear surface of the substrate SUB.

The second circuit member CCM2 may extend in the second direction DR2. The second circuit member CCM2 may include a protrusion part protruding in the third direction DR3. The second circuit member CCM2 may be electrically connected to the first circuit member CCM1 at an end on a side opposite to the protrusion part and electrically connected to the third circuit member CCM3 at the protrusion part. In an embodiment, the second circuit member CCM2 may be a printed circuit board.

The third circuit member CCM3 may extend in the third direction DR3. Ends (e.g., both ends) of the third circuit member CCM3 may be electrically connected to the second circuit member CCM2 and the driving board 30, respectively. In an embodiment, the third circuit member CCM3 may be a line connection film. A length of the third circuit member CCM3 may be adjusted, and a position of the driving board 30 may be adjusted.

The circuit member CCM may be bent, and the driving board 30 may be disposed behind the substrate SUB. In an embodiment, the driving board 30 may be spaced apart from the display panel 10.

The driving board 30 may be positioned on a side opposite to the display panel 10. The vapor chamber 20 may be disposed between the driving board 30 and the display panel 10. In an embodiment, the driving board 30 may overlap the center of the vapor chamber 20 in a plan view. The driving board 30 may be supported and fixed by support parts SPT disposed between the vapor chamber 20 and the driving board 30.

The driving board 30 may include a processor, a memory, and/or an interface. In an embodiment, the driving board 30 may include various electronic components such as integrated circuit chips (ICs).

In FIG. 4, the display device 1 may have a chip on film (COF) structure in which the substrate SUB, the circuit member CCM, and the driving board 30 are sequentially and electrically connected to each other, but the disclosure is not limited thereto. In another embodiment, the display device 1 may have a chip on plastic (COP) structure in which the driving board 30 is mounted (e.g., directly mounted) on the substrate SUB without the circuit member CCM and the substrate SUB itself is bent. In the embodiment, the driving board 30 may be disposed on the rear surface of the display panel 10 and the vapor chamber 20 may be disposed between the display panel 10 and the driving board 30. However, the structure is not limited thereto.

The vapor chamber 20 may be disposed between the display panel 10 and the driving board 30. The vapor chamber 20 may be disposed behind the display panel 10 and be disposed in front of the driving board 30.

In the disclosure and the drawings, the term "behind" refers to the direction opposite to the third direction DR3, and the phrase "in front of" refers to the third direction DR3.

In some embodiments, the vapor chamber 20 may be in contact (e.g., direct contact) with the rear surface of the display panel 10. Accordingly, heat generated from the display panel 10 may be transferred to the vapor chamber 20.

As illustrated in FIG. 4, the vapor chamber 20 may be spaced apart from the driving board 30. The support parts SPT may be disposed between the vapor chamber 20 and the driving board 30. However, the disclosure is not limited thereto, the vapor chamber 20 may be in contact (e.g., direct contact) with the driving board 30 without the support parts SPT or a spaced distance between the vapor chamber 20 and the driving board 30 may be minimized even though the support parts SPT exist between the vapor chamber 20 and the driving board 30. Thus, a thickness of the display device 1 may be decreased and heat dissipation efficiency thereof may be increased. Accordingly, heat generated from the driving board 30 may be transferred to the vapor chamber 20.

The vapor chamber 20 may dissipate the heat generated from the display panel 10 and the driving board 30 to another space inside the display device 1 or to the outside of the display device 1.

Figure 6:
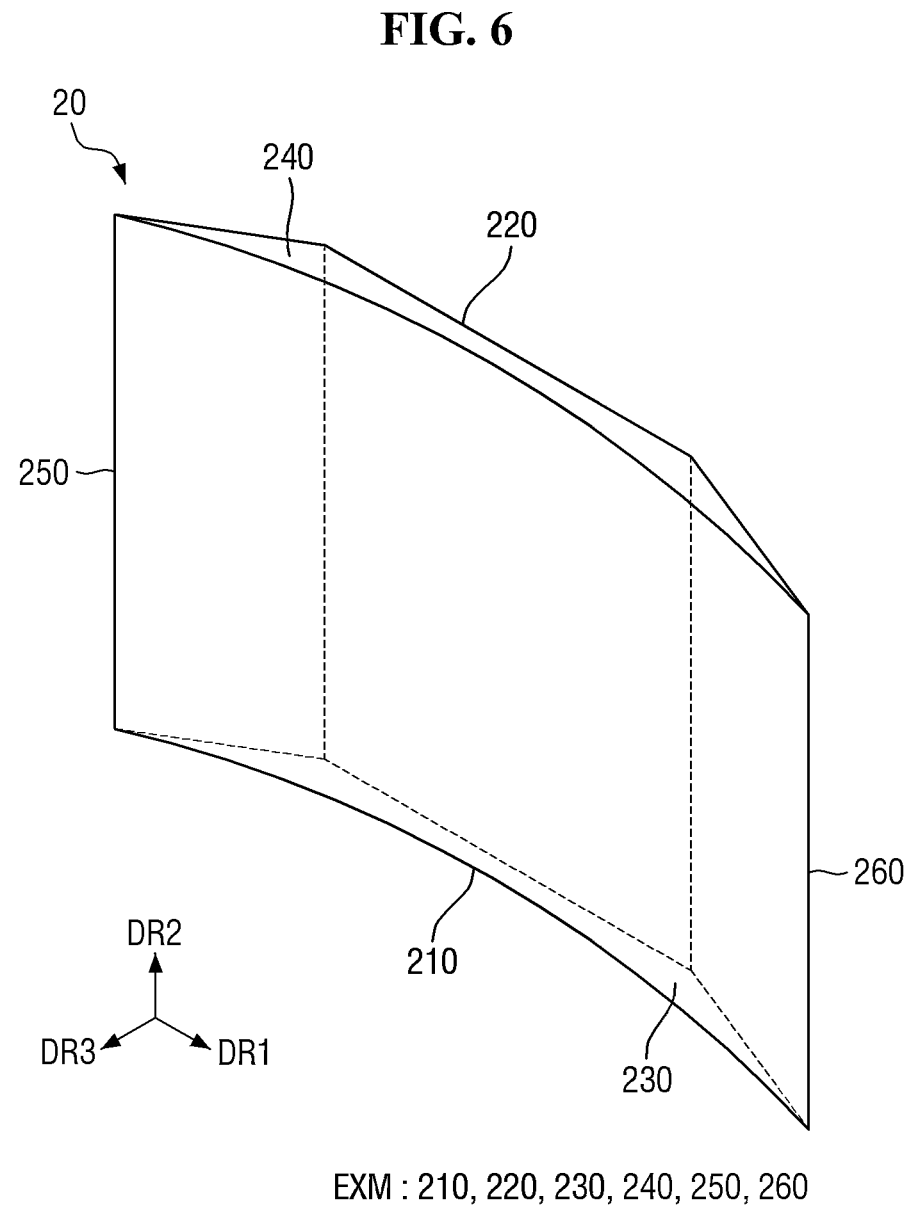
Figure 7:
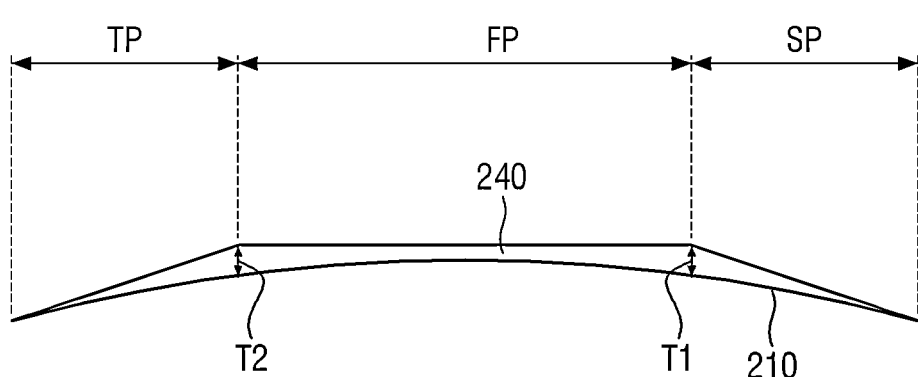
FIG. 7 is a schematic plan view of the vapor chamber according to an embodiment viewed from above.
Figure 7:
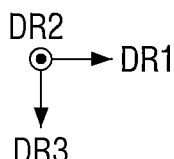
Figure 8:
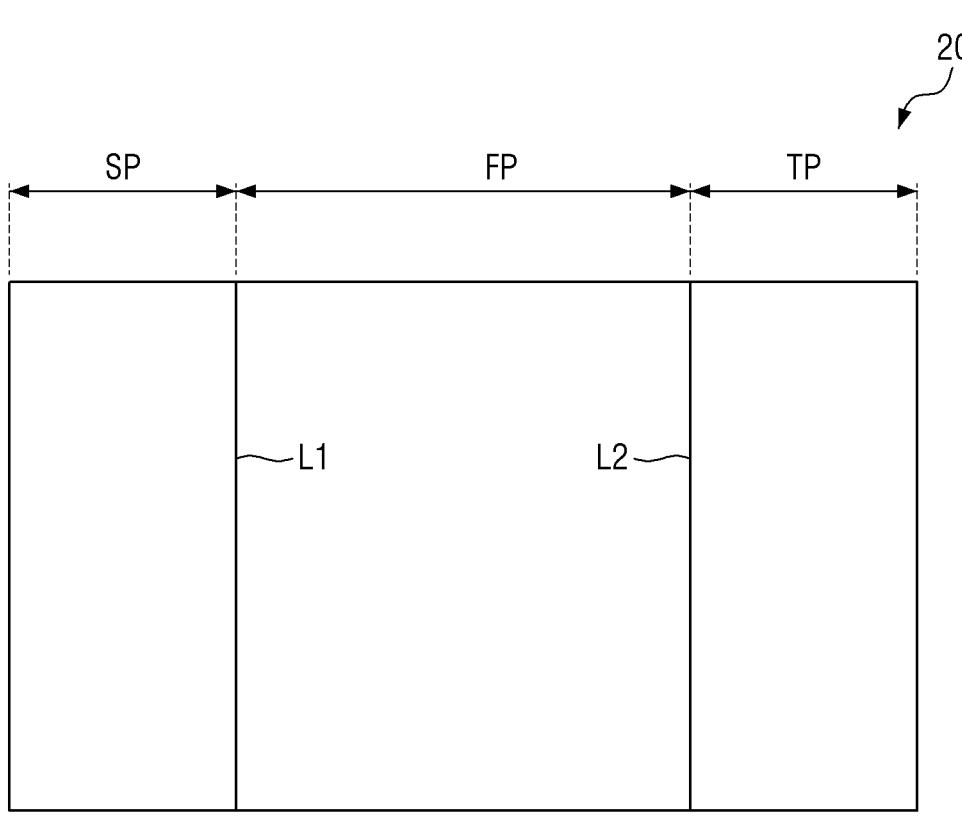
FIG. 8 is a schematic rear view illustrating a rear surface of the vapor chamber according to an embodiment.
Figure 8:
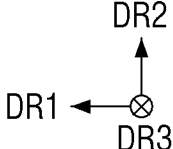
Figure 9:
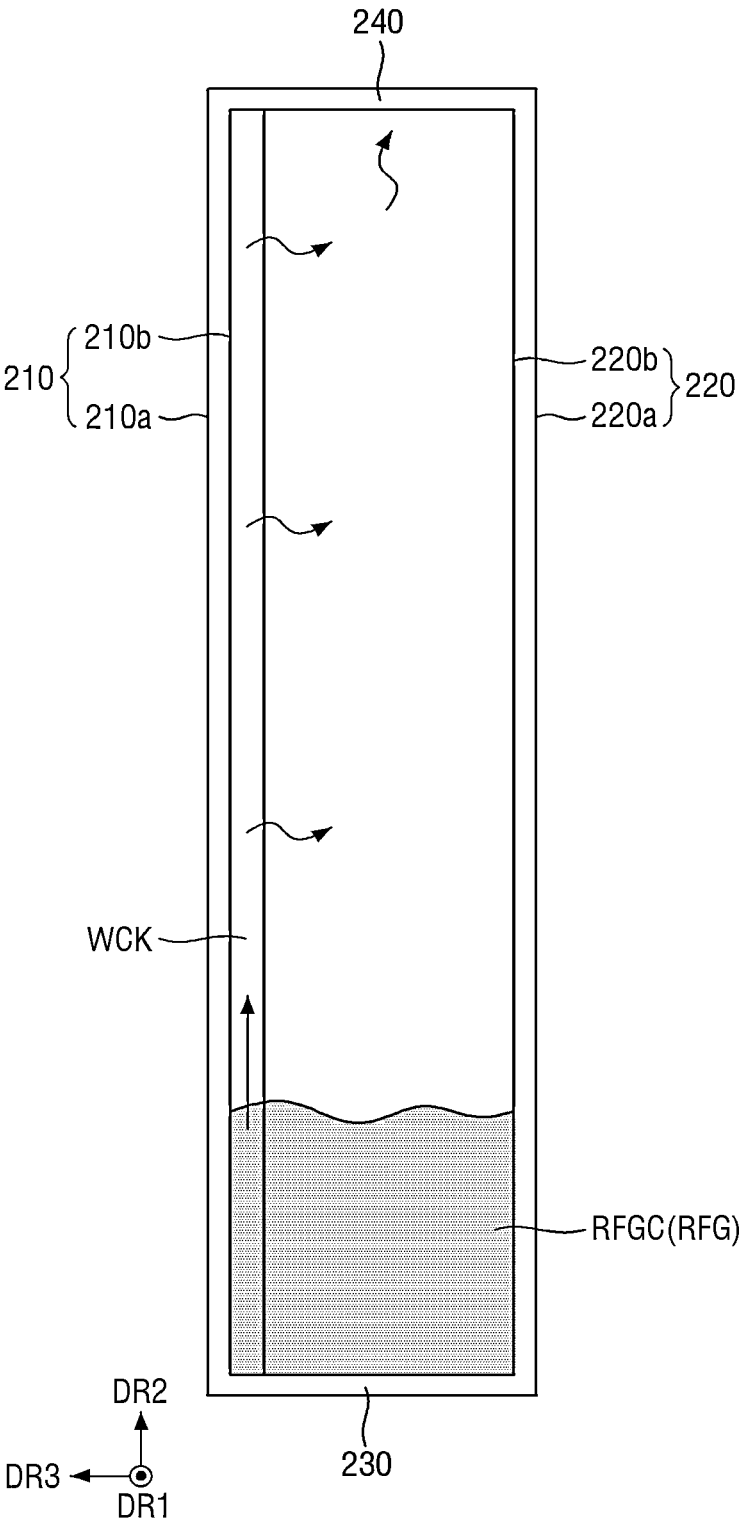
FIG. 9 is a schematic side view illustrating a side surface of the vapor chamber according to an embodiment.
Figure 10:
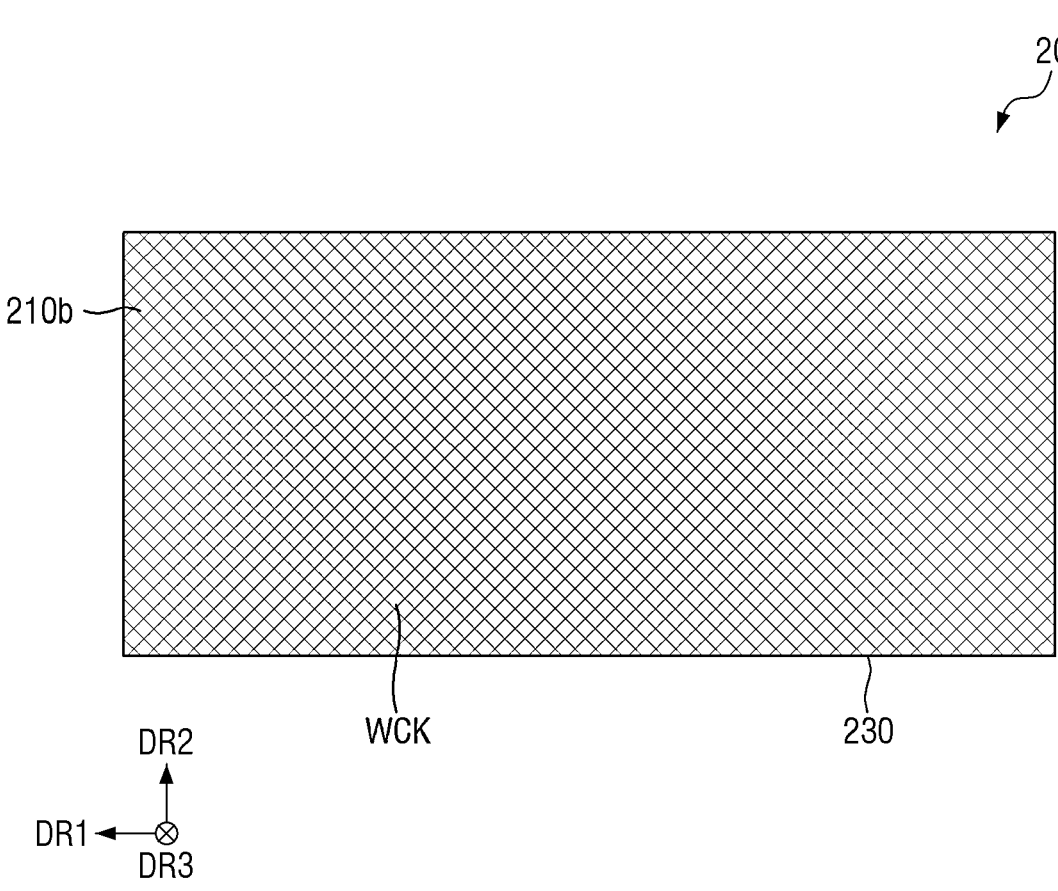
FIG. 10 is a schematic rear view illustrating a rear surface of a front surface member of the vapor chamber according to an embodiment.
Figure 11:
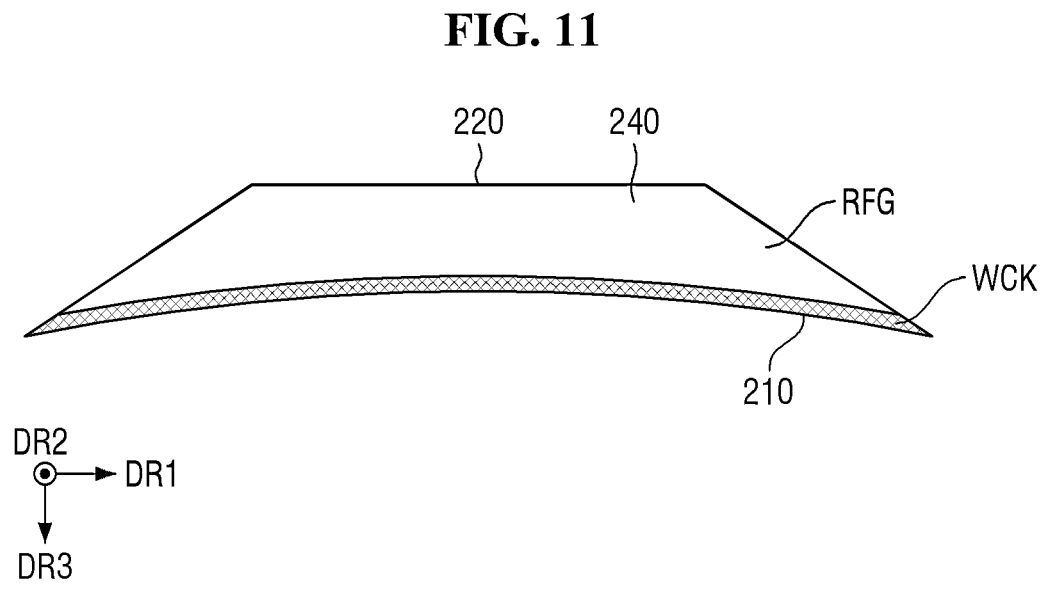

FIG. 6 is a schematic perspective view illustrating a vapor chamber according to an embodiment. FIG. 7 is a schematic plan view of the vapor chamber according to an embodiment viewed from above. FIG. 8 is a schematic rear view illustrating a rear surface of the vapor chamber according to an embodiment. FIG. 9 is a schematic side view illustrating a side surface of the vapor chamber according to an embodiment. FIG. 10 is a schematic rear view illustrating a rear surface of a front surface member of the vapor chamber according to an embodiment. FIG. 11 is a schematic cross-sectional view of the vapor chamber according to an embodiment.

Referring to FIGS. 6 to 11, the vapor chamber 20 may include an exterior member EXM, a wick WCK, and a refrigerant RFG.

The exterior member EXM may partition an accommodation space in which the refrigerant RFG may be disposed within the vapor chamber 20. In an embodiment, the exterior member EXM may be made of a stainless steel material such as STS or SUS.

The exterior member EXM may include a front surface member 210 (e.g., a first surface member), a rear surface member 220 (e.g., a second surface member), a lower surface member 230 (e.g., a third surface member), and an upper surface member 240 (e.g., a fourth surface member).

In the disclosure and the drawings, a front surface refers to a surface viewed along the direction opposite to the third direction DR3, and a rear surface refers to a surface viewed along the third direction DR3. A lower surface (or a bottom surface) refers to a surface viewed along the second direction DR2, and an upper surface (or a top surface) refers to a surface viewed along a direction opposite to the second direction DR2.

In an embodiment, the exterior member EXM may be a single member that is physically connected. For example, the front surface member 210, the rear surface member 220, the lower surface member 230, and the upper surface member 240 may be a single member that is physically connected. However, the disclosure is not limited thereto, and separate individual disconnected members may be coupled to each other to form an exterior member EXM. Coupling members may be studs or screws.

An outer side surface 210*a* (e.g., a front surface) of the front surface member 210 may face (e.g., directly face) the display panel 10. An inner side surface 210*b* (e.g., a rear surface) of the front surface member 210 may be in contact (e.g., direct contact) with the refrigerant RFG positioned inside the vapor chamber 20. The front surface member 210 may be a curved surface having a curvature. The front surface member 210 and the display panel 10 disposed on the front surface member 210 may have a similar curvature or a same curvature. The display panel 10 (e.g., refer to FIG. 1) may have a curved surface following the curvature of the front surface member 210. The outer side surface 210*a* of the front surface member 210 may be an area in contact (e.g., direct contact) with the display panel 10. The outer side surface 210*a* of the front surface member 210 and the display panel 10 may have a same size (e.g., substantially the same size).

An outer side surface 220*a* (e.g., a rear surface) of the rear surface member 220 may face (e.g., directly face) the driving board 30. An inner side surface 220*b* (e.g., a front surface) of the rear surface member 220 may be in contact (e.g., direct contact) with the refrigerant RFG positioned inside the vapor chamber 20. The rear surface member 220 may have a partially bent shape. For example, the rear surface member 220 may include bent areas.

The rear surface member 220 may include a first area FP, a second area SP, and a third area TP.

The first area FP may be an area occupying most of the rear surface member 220, and may correspond to a central area of the rear surface member 220. The first area FP may extend from the lower surface member 230 to the upper surface member 240 in the second direction DR2. The first area FP may be a flat surface that does not have a curvature unlike the front surface member 210.

The second area SP may extend from a side of the first area FP and be connected to the front surface member 210. The second area SP may be disposed in the first direction DR1 from the first area FP. The second area SP may extend from the lower surface member 230 to the upper surface member 240 in the second direction DR2. The second area SP may be bent at an angle (e.g., a predetermined or selectable angle) from the first area FP and extend from the first area FP. The second area SP may be a flat surface.

The third area TP may extend from another side of the first area FP and be connected to the front surface member 210. The third area TP may be disposed in a direction opposite to the first direction DR1 from the first area FP. The third area TP may extend from the lower surface member 230 to the upper surface member 240 in the second direction DR2. The third area TP may be bent at an angle (e.g., a predetermined or selectable angle) from the first area FP and extend from the first area FP. The third area TP may be a flat surface.

A direction in which each of the second area SP and the third area TP is bent may be a direction toward the front surface member 210. Each of the second area SP and the third area TP may be bent toward the front surface member 210 and be connected to the front surface member 210. A portion of the second area SP may be bent at a boundary between the first area FP and the second area SP, and a portion of the third area TP may be bent at a boundary between the first area FP and the third area TP. Each of such boundaries may be formed as a line. A first boundary line L1 between the first area FP and the second area SP may extend in the second direction DR2, and a second boundary line L2 between the first area FP and the third area TP may extend in the second direction DR2. The first boundary line L1 between the first area FP and the second area SP may be disposed in parallel with the second boundary line L2 between the first area FP and the third area TP.

In an embodiment, the first boundary line L1 between the first area FP and the second area SP may be disposed between about ⅕ and about ⅓ of a length of the rear surface member 220 in the second direction DR2 from a side of the rear surface member 220 in a plan view. The second boundary line L2 between the first area FP and the third area TP may be disposed between about ⅕ and about ⅓ of a length of the rear surface member 220 in the second direction DR2 from another side of the rear surface member 220 in a plan view. In some embodiments, the first boundary line L1 between the first area FP and the second area SP may be disposed at a point corresponding to about ¼ of the length of the rear surface member 220 in the second direction DR2 from the side of the rear surface member 220 in a plan view, and the second boundary line L2 between the first area FP and the third area TP may be disposed at a point corresponding to about ¼ of the length of the rear surface member 220 in the second direction DR2 from the another side of the rear surface member 220 in a plan view. However, the disclosure is not limited thereto.

In the vapor chamber 20, the front surface member 210 having the curvature and the rear surface member 220 having the bent shape may be coupled to each other, and an interval between the front surface member 210 and the rear surface member 220 may be different for each area. For example, in the first area FP of the rear surface member 220, an interval between the front surface member 210 and the rear surface member 220 measured at the center of the first area FP may be the smallest, and an interval between the front surface member 210 and the rear surface member 220 measured at an edge of the first area FP may be the greatest. In some embodiments, the interval between the front surface member 210 and the rear surface member 220 may gradually decrease from the center of the rear surface member 220 toward the side and the another side of the rear surface member 220.

In the second area SP of the rear surface member 220, an interval between the front surface member 210 and the rear surface member 220 measured at a side of the second area SP (e.g., measured at the first boundary line L1 between the first area FP and the second area SP) may be the greatest, and an interval between the front surface member 210 and the rear surface member 220 measured at another side of the second area SP (e.g., an area in which the second area SP and the front surface member 210 meet) may be the smallest. In some embodiments, in the second area SP, the interval between the front surface member 210 and the rear surface member 220 may gradually decrease as a distance from the first area FP increases.

In the third area TP of the rear surface member 220, an interval between the front surface member 210 and the rear surface member 220 measured at a side (e.g., a boundary) of the third area TP (e.g., measured at the second boundary line L2 between the first area FP and the third area TP) may be the greatest, and an interval between the front surface member 210 and the rear surface member 220 measured at another side (e.g., another boundary) of the third area TP (e.g., measured in an area or a boundary in which the third area TP and the front surface member 210 meet) may be the smallest. In some embodiments, in the third area TP, the interval between the front surface member 210 and the rear surface member 220 may gradually decrease as a distance from the first area FP increases.

An interval T1 between the front surface member 210 and the rear surface member 220 measured at the first boundary line L1 between the first area FP and the second area SP may be the same as an interval T2 between the front surface member 210 and the rear surface member 220 measured at the second boundary line L2 between the first area FP and the third area TP. As described above, the rear surface member 220 may include the second area SP and the third area TP formed to be bent from the first area FP. For example, the second area SP of the rear surface member 220 may be bent from the first area FP, and the third area TP of the rear surface member 220 may be bent from the first area FP. Thus, a volume of a refrigerant RFG embedded in the vapor chamber 20 may be significantly increased. Detailed description of the volume of the refrigerant RFG is provided below. Accordingly, the heat generated from the display panel 10 may be effectively dissipated by the refrigerant RFG.

According to an embodiment, the vapor chamber 20 may include the front surface member 210 having the curvature and the rear surface member 220 having the bent shape, and rigidity of the vapor chamber 20 may be improved. For example, the front surface member 210 and the rear surface member 220 may have a same curvature, and the rigidity of the vapor chamber 20 according to an embodiment may be improved by about 24% in a transverse direction and improved by about 4% in an axial direction. Thus, a rigidity of the entire vapor chamber 20 may be improved by about 28%. In case that a coupling member for coupling the rear surface member 220 and the front surface member 210 to each other is formed, damage due to the coupling member in the rear surface member 220 including flat surfaces may be decreased compared with the rear surface member 220 having a curvature (e.g., a curved surface).

The refrigerant RFG may be positioned inside the vapor chamber 20 in a liquid state or a gas state. The refrigerant RFG may include a phase change material (PCM). The refrigerant RFG may absorb heat from a contact object while vaporizing, and may dissipate the heat to the surroundings (e.g., to the outside) while condensing.

In some embodiments, the refrigerant RFG may be positioned at a lower portion (e.g., a refrigerant dense part RFGC positioned on the lower surface member 230) of the vapor chamber 20, in case that the refrigerant RFG is in the liquid state. The refrigerant RFG positioned at the refrigerant dense part RFGC may move upward along an inner side surface of the vapor chamber 20 through the wick WCK. The refrigerant RFG may circulate throughout an internal space of the vapor chamber 20 in case that the refrigerant RFG is in the gas state.

The wick WCK may be disposed on the inner side surface 210*b* (e.g., an entire area of the inner side surface 210*b*) of the front surface member 210. The wick WCK may be a wick structure having a capillary structure. As an example, the wick WCK may be a wick structure having a projection shape. The wick WCK may generate a capillary phenomenon to cause the refrigerant RFG positioned at a lower portion of the wick WCK to rise in a direction opposite to a direction of gravity.

The wick WCK may be disposed on the inner side surface 210*b* of the front surface member 210. The wick WCK may be disposed over an entire area in which the front surface member 210 overlaps the display panel 10 in a plan view. The wick WCK may overlap an entire area of the display panel 10 in a plan view. As an example, the wick WCK may be disposed over the inner side surface 210*b* (e.g., the entire inner side surface 210*b*) of the front surface member 210.

The refrigerant RFG of the refrigerant dense part RFGC may move along a surface of the wick WCK in the liquid state and be positioned on the inner side surface 210*b* (e.g., the entire inner side surface 210*b*) of the front surface member 210. In case that the heat generated from the display panel 10 by driving of the display panel 10 is transferred to the front surface member 210, the refrigerant RFG positioned in the wick WCK may vaporize.

The refrigerant RFG in the gas state may circulate inside the vapor chamber 20 and condense on the inner side surface of the vapor chamber 20 having a relatively low temperature. As an example, the refrigerant RFG in the gas state may condense on a condensable area in which the wick WCK is not disposed. As another example, the heat of the display panel 10 may not be transferred in a vaporizable area in which the wick WCK is disposed, and the refrigerant RFG in the gas state may condense on a portion having a relatively low temperature (e.g., on the inner side surface of the rear surface member). As still another example, the refrigerant RFG in the gas state may condense on the lower surface member 230, the upper surface member 240, a first side surface member 250, and a second side surface member 260 on which the wick WCK of the vapor chamber 20 is not disposed. The refrigerant RFG may dissipate the heat to a place that does not overlap the display panel 10 in a plan view while condensing. Accordingly, the vapor chamber 20 may dissipate the heat of the display panel 10.

In case that the display panel 10 is driven, heat generation of the display panel 10 may be the greatest at points of one-third and two-thirds of the display panel 10 in a plan view. For example, such areas may be areas corresponding to points of one-third and two-thirds of the display panel 10 in the first direction DR1 from the left side of the display panel 10 in FIG. 2. According to an embodiment, the first boundary line L1 between the first area FP and the second area SP of the rear surface member 220 of the vapor chamber 20 may be disposed adjacent to the point of two-thirds of the display panel 10 in a plan view, and the second boundary line L2 between the first area FP and the third area TP of the rear surface member 220 of the vapor chamber 20 may be disposed adjacent to the point of one-third of the display panel 10 in a plan view. Accordingly, the volume of the refrigerant RFG embedded in the vapor chamber 20 may be increased in an area of the display panel 10 in which the heat generation is great, and the heat of the display panel 10 may be effectively dissipated.

Figure 12:
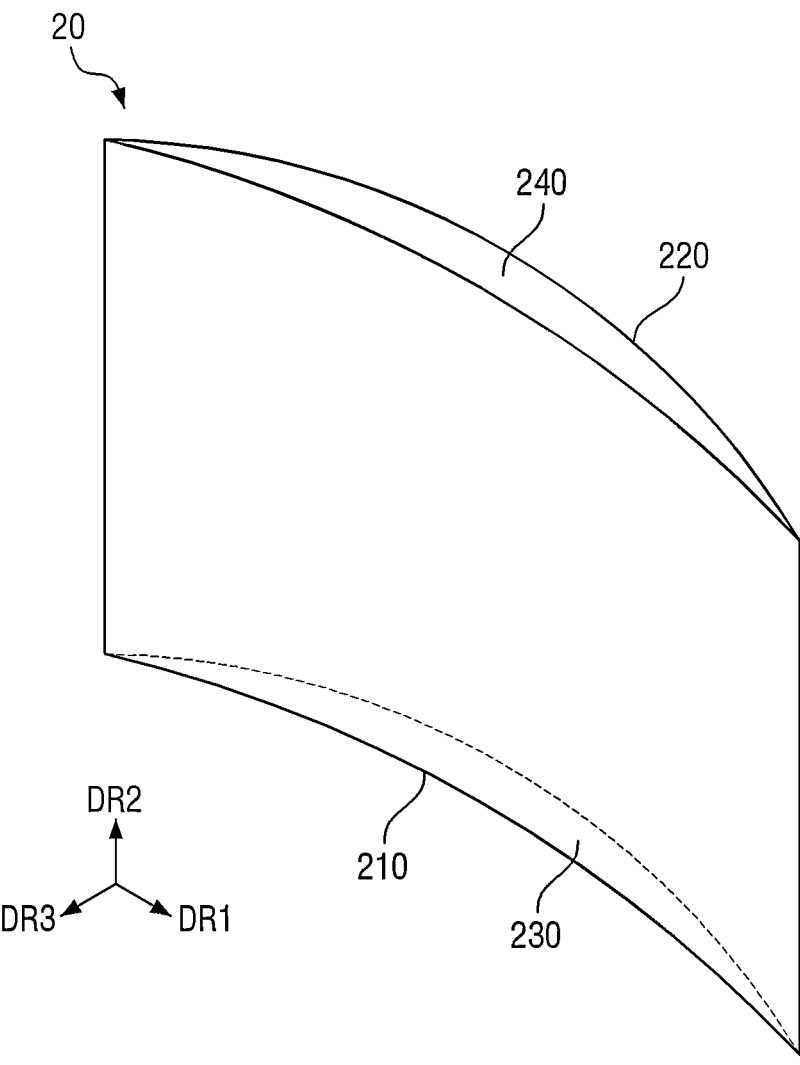
FIG. 12 is a schematic perspective view illustrating a vapor chamber according to another embodiment.
Figure 13:
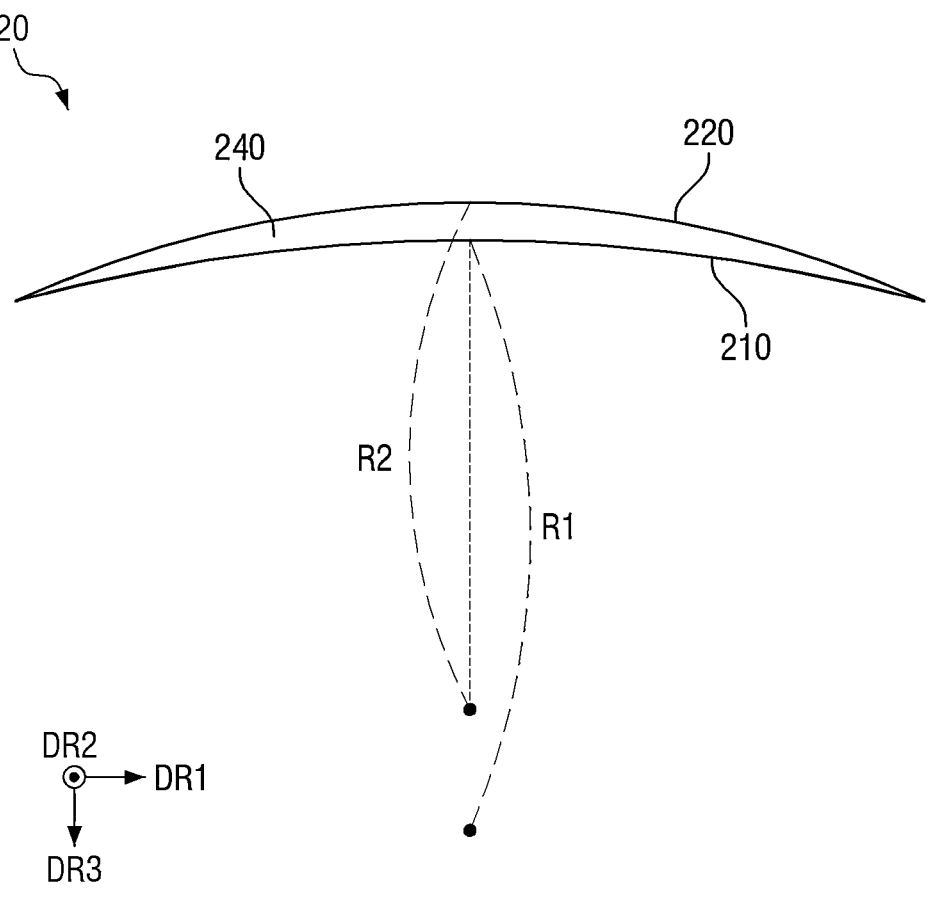
FIG. 13 is a schematic plan view of the vapor chamber according to another embodiment viewed from above.
Figure 14:
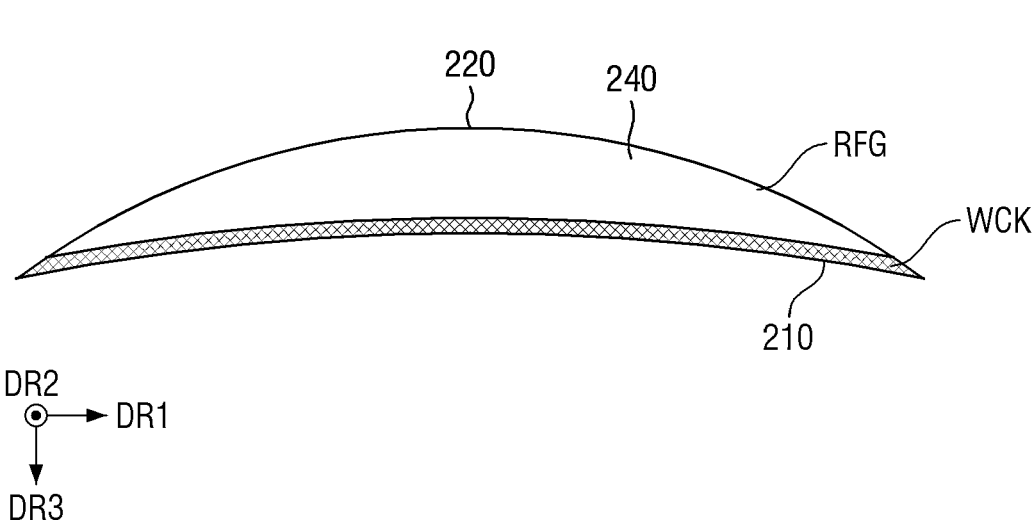
FIG. 14 is a schematic cross-sectional view illustrating the vapor chamber according to another embodiment.

FIG. 12 is a schematic perspective view illustrating a vapor chamber according to another embodiment. FIG. 13 is a schematic plan view of the vapor chamber according to another embodiment viewed from above. FIG. 14 is a schematic cross-sectional view illustrating the vapor chamber according to another embodiment.

Referring to FIGS. 12 to 14, a vapor chamber 20 according to the embodiment is different from the vapor chamber 20 according to the embodiment described above with reference to FIGS. 6 to 11 at least in that a rear surface member 220 is formed as a curved surface having a curvature. Hereinafter, a detailed description of the same constituent elements is omitted, and contents different from those of the above-described embodiment are described.

The vapor chamber 20 may include a rear surface member 220. The rear surface member 220 may face the front surface member 210 having a curvature and be formed as a curved surface having a curvature. The rear surface member 220 may be spaced apart from the front surface member 210 in an area (e.g., a predetermined or selectable area). For example, the rear surface member 220 and the front surface member 210 may be spaced apart from each other except for side portions (e.g., both side portions) of the rear surface member 220.

According to the embodiment, the front surface member 210 may have a curved surface having a radius (e.g., a predetermined or selectable radius) of curvature R1, and the rear surface member 220 may have a curved surface having a radius (e.g., a predetermined or selectable radius) of curvature R2. The rear surface member 220 facing the front surface member 210 may have the radius of curvature R2 different from the radius of curvature R1 of the front surface member 210. For example, the radius of curvature R2 of the rear surface member 220 may be smaller than the radius of curvature R1 of the front surface member 210. The radius of curvature R2 of the rear surface member 220 may be smaller than the radius of curvature R1 of the front surface member 210, and the rear surface member 220 may be adjacent to (e.g., surround) the front surface member 210 on a rear surface of the front surface member 210.

The front surface member 210 and the rear surface member 220 may be spaced apart from each other with an interval (e.g., a predetermined or selectable interval). In the embodiment, an interval between the front surface member 210 and the rear surface member 220 may be different for each area. For example, an interval between the front surface member 210 and the rear surface member 220 at an edge of the vapor chamber 20 may be smaller than an interval between the front surface member 210 and the rear surface member 220 at the center of the vapor chamber 20. In some embodiments, the interval between the front surface member 210 and the rear surface member 220 may gradually decrease from the center of the rear surface member 220 in a plan view in the first direction DR1 and the direction opposite to the first direction DR1.

In the embodiment, the front surface member 210 and the rear surface member 220 of the vapor chamber 20 may be spaced apart from each other with the interval, and a volume of the refrigerant RFG embedded in the vapor chamber 20 may be increased to effectively dissipate heat generated from the display panel 10. The vapor chamber 20 may include the wick WCK in the front surface member 210 and dissipate the heat generated from the display panel 10.

Figure 15:
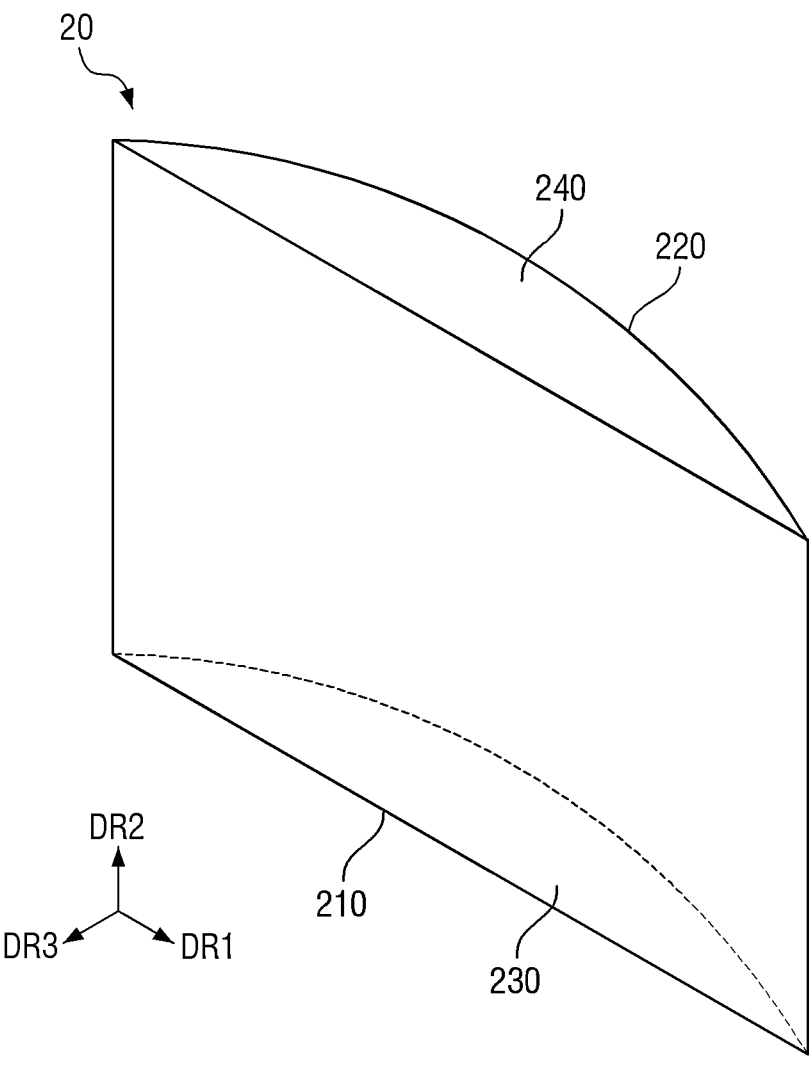
FIG. 15 is a schematic perspective view illustrating a vapor chamber according to still another embodiment.
Figure 16:
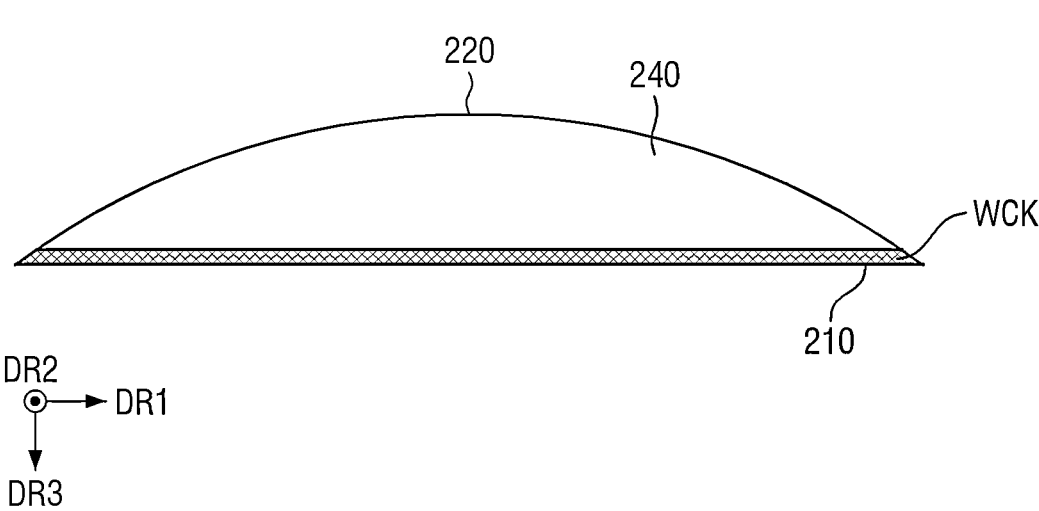
FIG. 16 is a schematic plan view of the vapor chamber according to still another embodiment viewed from above.

FIG. 15 is a schematic perspective view illustrating a vapor chamber according to still another embodiment. FIG. 16 is a schematic plan view of the vapor chamber according to still another embodiment viewed from above.

Referring to FIGS. 15 and 16, the embodiment is different from the embodiments described above with reference to FIGS. 6 to 14 at least in that a front surface member 210 is formed as a flat surface. Hereinafter, a detailed description of the same constituent elements is omitted, and contents different from those of the above-described embodiment are described.

A vapor chamber 20 may include a front surface member 210. The front surface member 210 may be formed as a flat surface. For example, the front surface member 210 may be formed as a flat surface without a curvature (e.g., a curved surface) unlike the above-described embodiments. The display panel 10 disposed on the vapor chamber 20 may also be formed as a flat surface. The rear surface member 220 may be formed as a curved surface having a curvature as in the embodiment described above with reference to FIGS. 12 to 14.

Since the front surface member 210 and the rear surface member 220 have different shapes, in the embodiment, the front surface member 210 and the rear surface member 220 of the vapor chamber 20 may be spaced apart from each other with an interval (e.g., a predetermined or selectable interval), and a volume of the refrigerant RFG embedded in the vapor chamber 20 may be increased to effectively dissipate heat generated from the display panel 10. The vapor chamber 20 may include the wick WCK in the front surface member 210 and dissipate the heat generated from the display panel 10.

Figure 17:
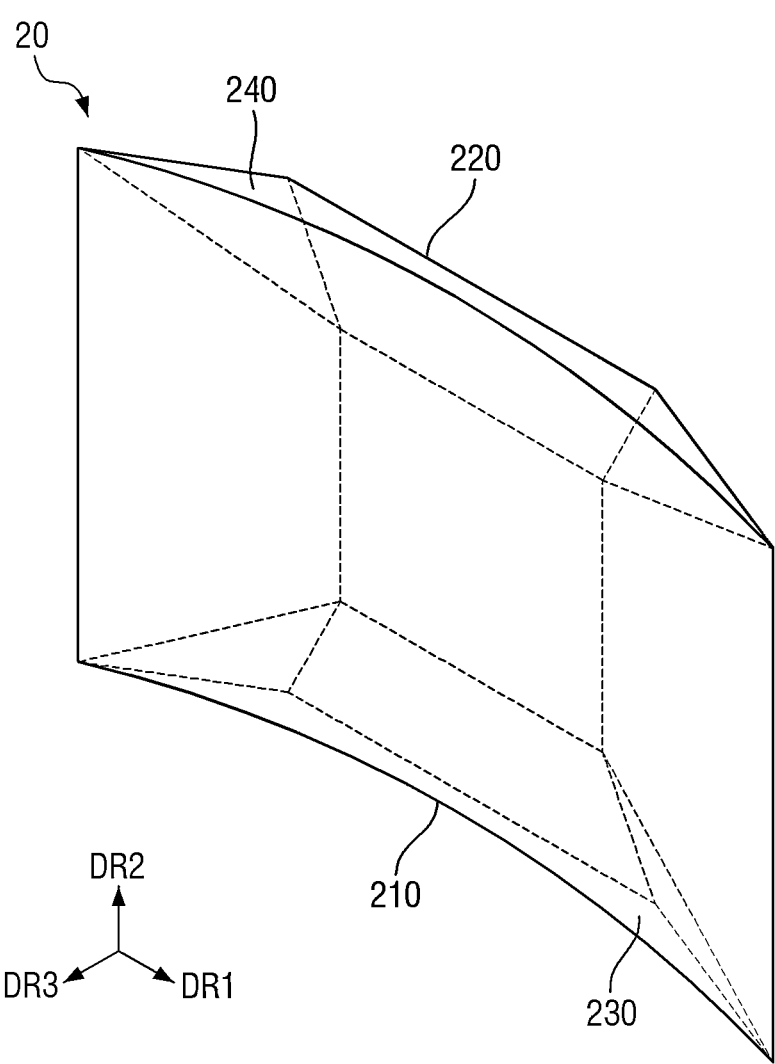
FIG. 17 is a schematic perspective view illustrating a vapor chamber according to still another embodiment.
Figure 18:
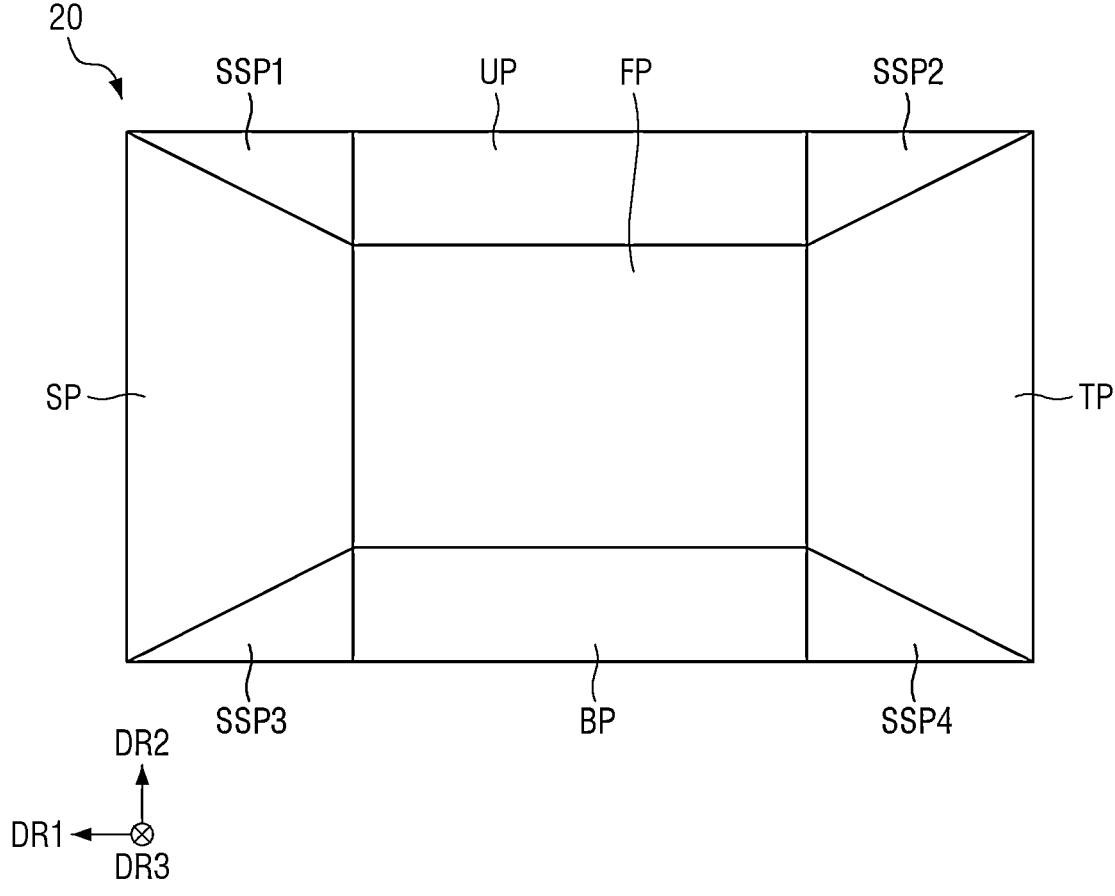
FIG. 18 is a schematic rear view illustrating a rear surface of the vapor chamber according to still another embodiment.
Figure 19:
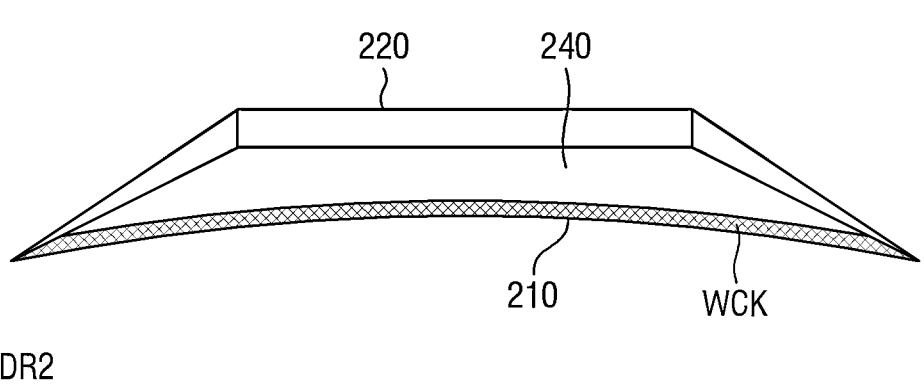
FIG. 19 is a schematic plan view of the vapor chamber according to still another embodiment viewed from above.

FIG. 17 is a schematic perspective view illustrating a vapor chamber according to still another embodiment. FIG. 18 is a schematic rear view illustrating a rear surface of the vapor chamber according to still another embodiment. FIG. 19 is a schematic plan view of the vapor chamber according to still another embodiment viewed from above.

Referring to FIGS. 17 to 19, a vapor chamber 20 according to the embodiment is different from the vapor chamber 20 according to the embodiment described above with reference to FIGS. 6 to 11 at least in that a rear surface member 220 is bent in four directions. Hereinafter, a detailed description of the same constituent elements is omitted, and contents different from those of the above-described embodiment are described.

The rear surface member 220 may include a first area FP, a second area SP, a third area TP, a fourth area UP, and a fifth area BP.

The first area FP may be an area occupying most of the rear surface member 220, and may correspond to a central area of the rear surface member 220. The first area FP may be disposed at the center of the rear surface member 220. The first area FP may be a flat surface without a curvature unlike the front surface member 210. The first area FP may have a polygonal shape. For example, the first area FP may have a quadrangular shape. However, the disclosure is not limited thereto.

The second area SP may extend from a side of the first area FP and be connected to the front surface member 210. The second area SP may be disposed in the first direction DR1 from the first area FP. The second area SP may have a width gradually increasing from a side of the first area FP in the first direction DR1. For example, the second area SP may have a trapezoidal shape in a plan view. The second area SP may be bent at an angle (e.g., a predetermined or selectable angle) from the first area FP and extend from the first area FP. The second area SP may be a flat surface.

The third area TP may extend from another side of the first area FP and be connected to the front surface member 210. The third area TP may be disposed in the direction opposite to the first direction DR1 from the first area FP. The third area TP may have a width gradually increasing from the another side of the first area FP in the direction opposite to the first direction DR1. For example, the third area TP may have a trapezoidal shape in a plan view. In some embodiments, the second area SP and the third area TP may have a same shape (or may be symmetric with respect to the first area FP). The third area TP may be bent at an angle (e.g., a predetermined or selectable angle) from the first area FP and extend from the first area FP. The third area TP may be a flat surface.

The fourth area UP may extend from an upper side of the first area FP and be connected to the front surface member 210. The fourth area UP may be disposed in the second direction DR2 from the first area FP. The fourth area UP may extend from the upper side of the first area FP at a same width in the second direction DR2. For example, the fourth area UP may have a rectangular shape in a plan view. The fourth area UP may be bent at an angle (e.g., a predetermined or selectable angle) from the first area FP and extend from the first area FP. The fourth area UP may be a flat surface.

The fifth area BP may extend from a lower side of the first area FP and be connected to the front surface member 210. The fifth area BP may be disposed in the direction opposite to the second direction DR2 from the first area FP. The fifth area BP may extend from the lower side of the first area FP at a same width in the direction opposite to the second direction DR2. For example, the fifth area BP may have a rectangular shape in a plan view. The fifth area BP may be bent at an angle (e.g., a predetermined or selectable angle) from the first area FP and extend from the first area FP. The fifth area BP may be a flat surface.

The rear surface member 220 of the vapor chamber 20 according to the embodiment may include (e.g., may further include) sub-areas SSP1, SSP2, SSP3, and SSP4 disposed between the respective areas. The sub-areas SSP1, SSP2, SSP3, and SSP4 may include a first sub-area SSP1 and a second sub-area SSP2 spaced apart from each other on the upper side of the first area FP, and may include a third sub-area SSP3 and a fourth sub-area SSP4 spaced apart from each other on the lower side of the first area FP.

The first sub-area SSP1 and the second sub-area SSP2 may be disposed on the upper side of the first area FP (e.g., may be disposed in the second direction DR2). The first sub-area SSP1 may be disposed between the fourth area UP and the second area SP, and the second sub-area SSP2 may be disposed between the fourth area UP and the third area TP. A side of the first sub-area SSP1 may be connected to the fourth area UP, and another side of the first sub-area SSP1 may be connected to the second area SP. The side of the second sub-area SSP2 may be connected to the fourth area UP, and the another side of the second sub-area SSP2 may be connected to the third area TP. Each of the first sub-area SSP1 and the second sub-area SSP2 may have a triangular shape in a plan view.

The third sub-area SSP3 and the fourth sub-area SSP4 may be disposed on the lower side of the first area FP (e.g., may be disposed in the direction opposite to the second direction DR2). The third sub-area SSP may be disposed between the fifth area BP and the second area SP, and the fourth sub-area SSP4 may be disposed between the fifth area BP and the third area TP. A side of the third sub-area SSP3 may be connected to the fifth area BP, and another side of the third sub-area SSP3 may be connected to the second area SP. A side of the fourth sub-area SSP4 may be connected to the fifth area BP, and another side of the fourth sub-area SSP4 may be connected to the third area TP. Each of the third sub-area SSP3 and the fourth sub-area SSP4 may have a triangular shape in a plan view.

According to the embodiment, the rear surface member 220 may have surfaces bent in several directions based on the first area SP and secure a space between the rear surface member 220 and the front surface member 210. Accordingly, the front surface member 210 and the rear surface member 220 of the vapor chamber 20 may be spaced apart from each other with an interval (e.g., a predetermined or selectable interval), and a volume of the refrigerant RFG embedded in the vapor chamber 20 may be increased and effectively dissipate heat generated from the display panel 10. The vapor chamber 20 may include wick WCK in the front surface member 210 and dissipate the heat generated from the display panel 10.

Figure 20:
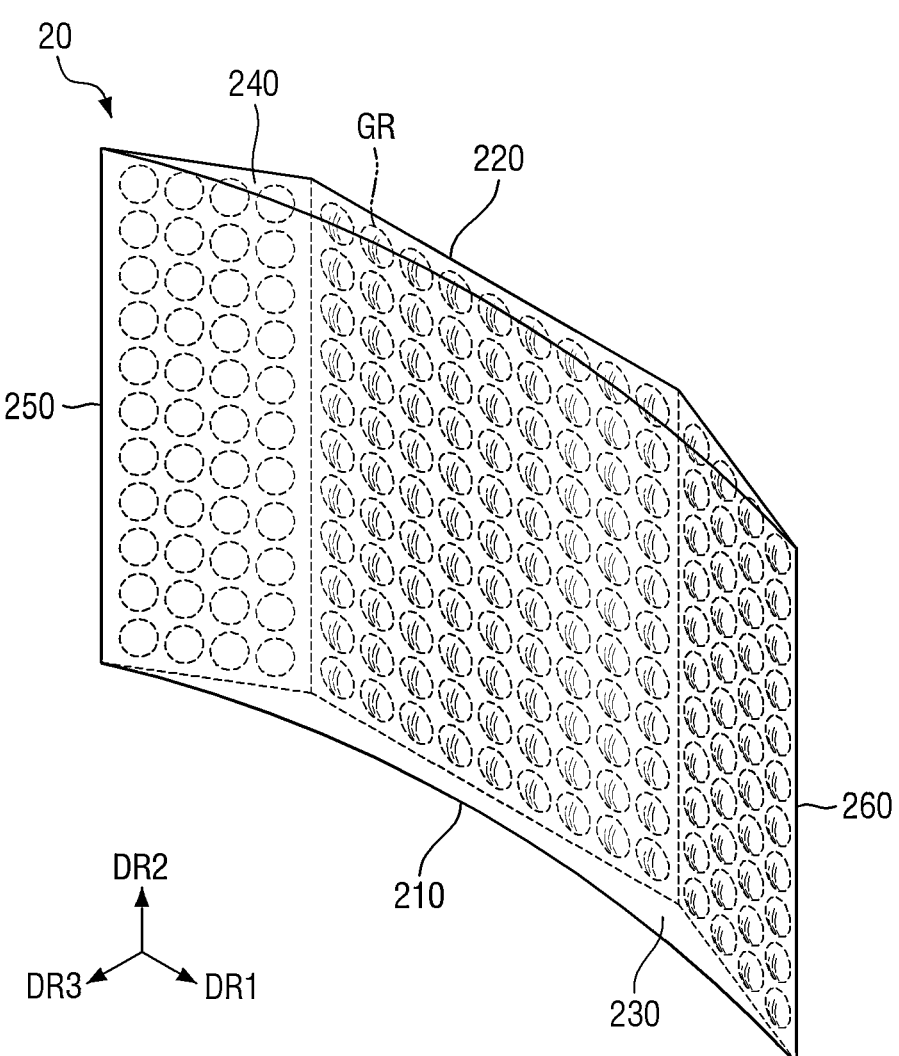
FIG. 20 is a schematic perspective view illustrating a vapor chamber according to still another embodiment.
Figure 21:
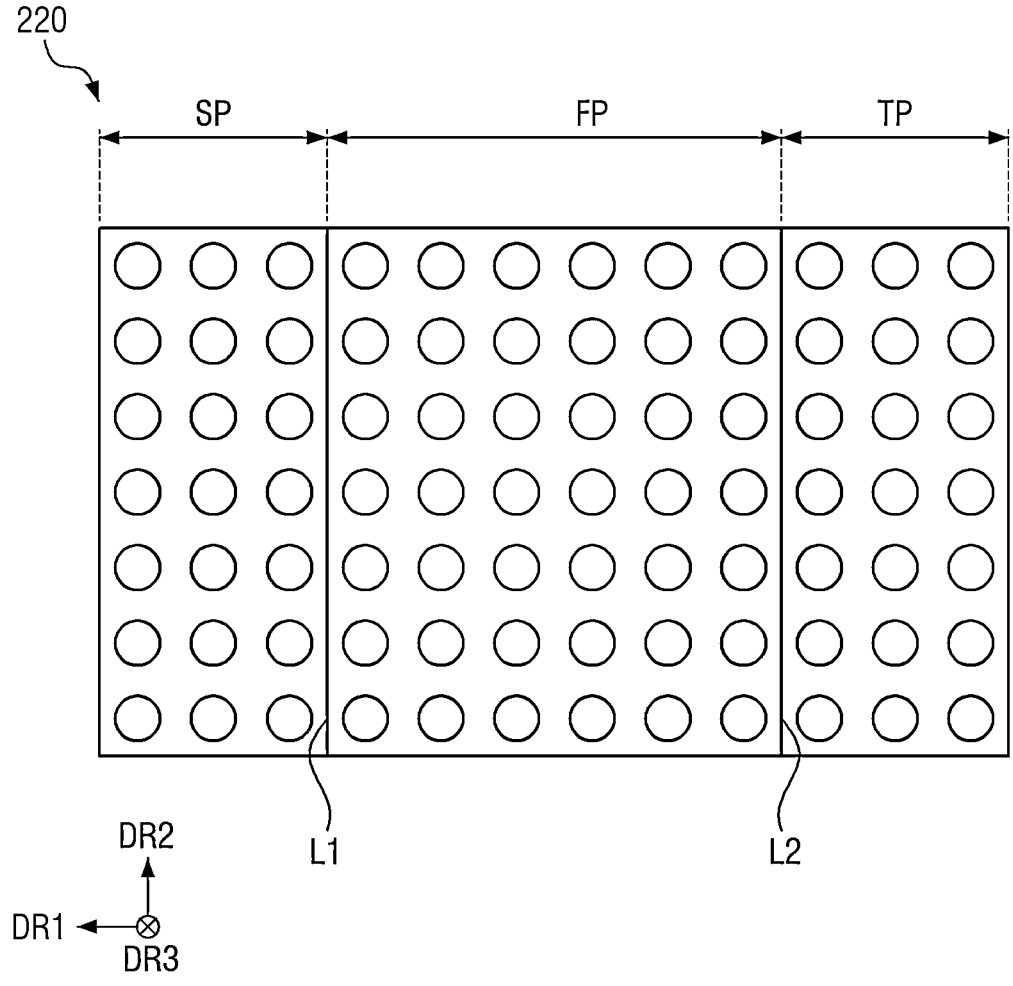
FIGS. 21 to 23 are schematic rear views illustrating various examples of a rear surface of the vapor chamber according to still another embodiment.
Figure 22:
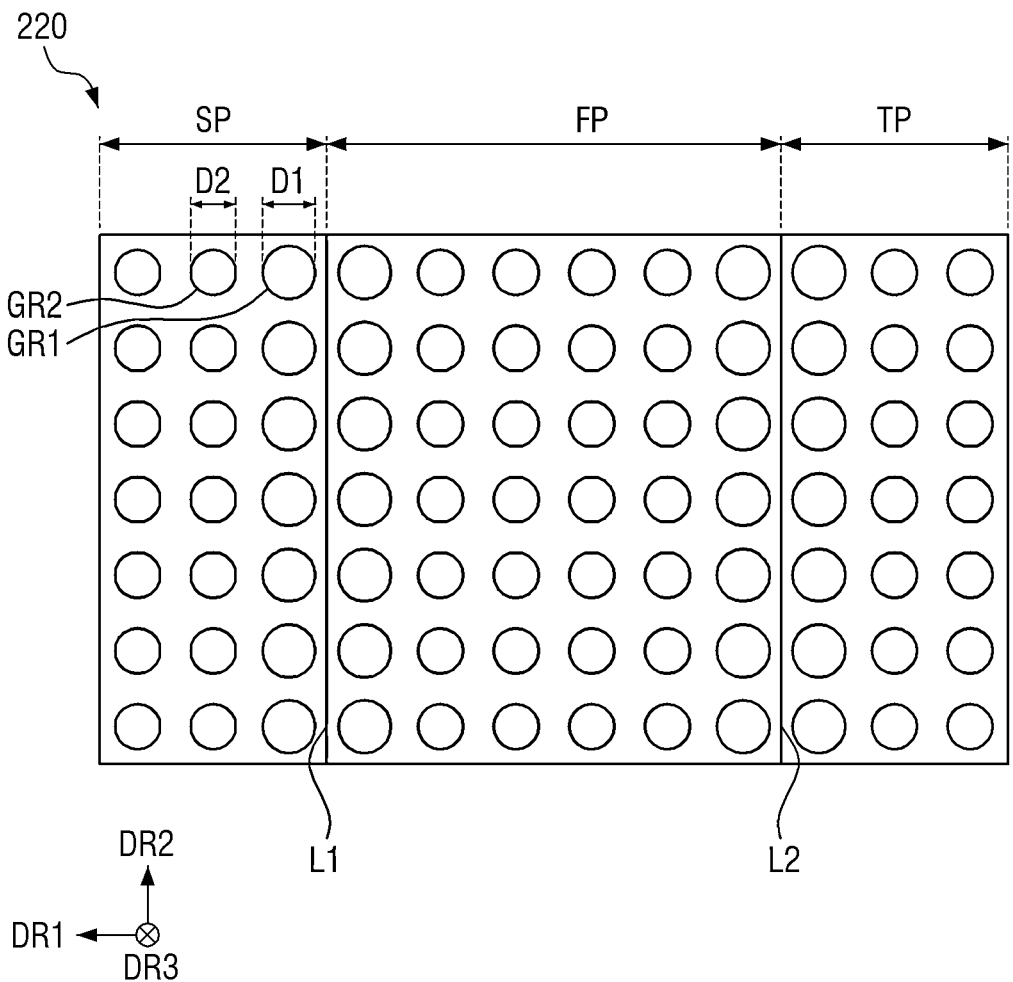
Figure 23:
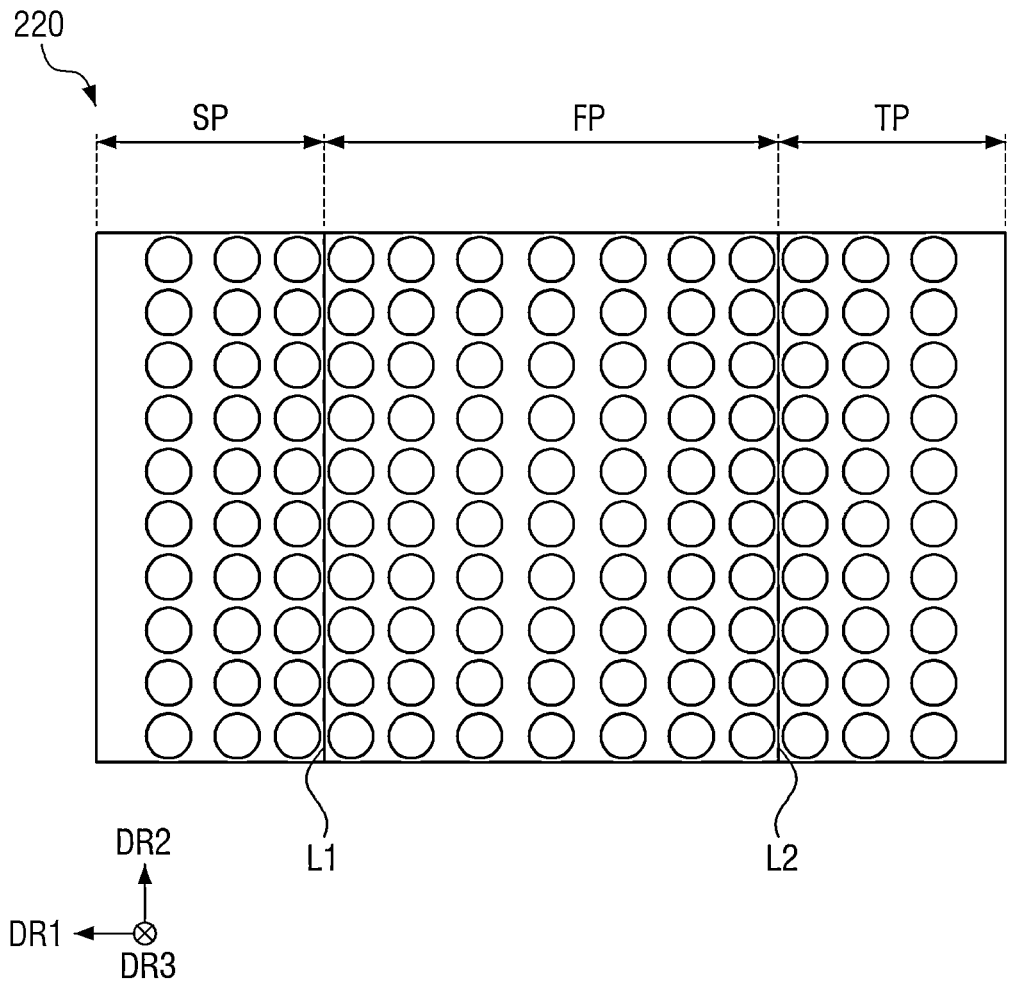

FIG. 20 is a schematic perspective view illustrating a vapor chamber according to still another embodiment. FIGS. 21 to 23 are schematic rear views illustrating various examples of a rear surface of the vapor chamber according to still another embodiment.

Referring to FIGS. 20 to 23, a vapor chamber 20 according to the embodiment is different from the vapor chambers 20 according to the embodiments described above with reference to FIGS. 6 to 19 at least in that a rear surface member 220 includes recessed parts GR. Hereinafter, a detailed description of the same constituent elements is omitted, and contents different from those of the above-described embodiment are described.

The rear surface member 220 may include the recessed parts GR in a surface thereof. The recessed parts GR may be recessed from the outside of the rear surface member 220 to the inside of the rear surface member 220. The recessed parts GR may increase a contact area between the rear surface member 220 and external air. For example, the recessed parts GR may increase an area in which the refrigerant RFG disposed inside the vapor chamber 20 absorbs heat and dissipates the heat to the surroundings (e.g., to the outside). Accordingly, the recessed parts GR of the rear surface member 220 may effectively dissipate the heat generated from the display panel 10.

The recessed parts GR may be concavely recessed in a circular or polygonal shape in a plan view. As an example, in case that the recessed parts GR have a circular shape in a plan view, the recessed parts GR may be recessed in a hemispherical shape, a cylindrical shape, a semi-elliptical shape, or the like. As another example, in case that the recessed parts GR have a polygonal shape in a plan view, the recessed parts GR may be recessed in a rectangular prismatic shape, a pentagonal prismatic shape, or the like. However, the disclosure is not limited thereto, and the recessed parts GR may have any recessed shape capable of increasing a surface area of the rear surface member 220. For example, the recessed parts GR may have a circular shape in a plan view and a hemispherical concave shape.

As illustrated in FIG. 21, the recessed parts GR may be formed in a same size and be disposed at equal intervals (e.g., disposed at a constant interval). For example, the recessed parts GR may be formed in a same size and be disposed at equal intervals in the first, second, and third areas FP, SP, and TP of the rear surface member 220.

As illustrated in FIG. 22, recessed parts GR may be formed in different sizes and be disposed at equal intervals. For example, the recessed parts GR may include first recessed parts GR1 and second recessed parts GR2. The first recessed parts GR1 may be disposed adjacent to the first boundary line L1 between the first area FP and the second area SP and the second boundary line L2 between the first area FP and the third areas TP, and the second recessed parts GR2 may be spaced apart from the first recessed parts GR1. A size of the first recessed part GR1 may be greater than a size of the second recessed part GR2. For example, a diameter D1 of the first recessed part GR1 may be greater than a diameter D2 of the second recessed part GR2.

In the embodiment, the first recessed parts GR1 may be disposed adjacent to the first boundary line L1 between first area FP and the second area SP and the second boundary line L2 between the first area FP and the third areas TP. The first boundary line L1 and the second boundary line L2 may correspond to portions where great heat appears in the display panel 10. Thus, the heat of the display panel 10 may be effectively dissipated.

As illustrated in FIG. 23, the recessed parts GR may be formed in a same size and be disposed at different intervals. For example, an interval between the recessed parts GR (e.g., at least some of the recessed parts GR) may be small in areas adjacent to the first boundary line L1 between the first area FP and the second area SP and the second boundary line L2 between the first area FP and the third area TP. An interval between the recessed parts GR (e.g., another recessed parts GR) may be great in areas relatively distant from the first boundary line L1 between the first area FP and the second area SP and the second boundary line L2 between the first area FP and the third area TP. For example, the interval between the recessed parts GR (e.g., at least some of the recessed parts GR) adjacent to the first boundary line L1 between the first area FP and the second area SP may be smaller than the interval between the recessed parts GR (e.g., another recessed parts GR) adjacent to the center of the first area FP. In some embodiments, the interval between the recessed parts GR may gradually increase from the first boundary line L1 between the first area FP and the second area SP toward the center of the first area FP. In some embodiments, the interval between the recessed parts GR may gradually increase in an area between the first boundary line L1 and the center of the rear surface member 220 and decrease in an area between the second boundary line L2 and the center of the rear surface member 220.

As described above, the rear surface member 220 of the vapor chamber 20 according to the embodiment may include the recessed parts GR and may effectively dissipate the heat of the display panel 10.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A vapor chamber comprising:
   a front surface member having a curvature, the front surface member being continuously curved;
   a rear surface member coupled to the front surface member;
   a wick disposed between the front surface member and the rear surface member; and
   a refrigerant at least partially filled between the front surface member and the rear surface member,
   wherein the rear surface member includes a plurality of bent areas,
   wherein the front surface member is convex toward the rear surface member,
   wherein the rear surface member comprises a first area, a second area bent from the first area, and a third area bent from the first area,
   wherein, the first area is disposed between the second area and the third area, and each of the first area, the second area, and the third area is formed as a flat surface, and wherein in the first area, an interval between the front surface member and the rear surface member gradually increases from a center of the first area toward the second area and from the center of the first area toward the third area.

2. The vapor chamber of claim 1, wherein
   the second area extends from a side of the first area and is connected to the front surface member,
   the third area extends from another side of the first area and is connected to the front surface member, and
   each of the second area and the third area is bent in a direction toward the front surface member.

3. The vapor chamber of claim 1, wherein
   the rear surface member further includes:
      a first boundary line along which the second area is bent; and
      a second boundary line along which the third area is bent,
   the first boundary line is disposed between the first area and the second area,
   the second boundary line is disposed between the first area and the third area, and
   the first boundary line and the second boundary line are parallel to each other.

4. The vapor chamber of claim 3, wherein
   the first boundary line is disposed between about ⅕ and about ⅓ of a length of the rear surface member in a direction from a side of the rear surface member in a plan view, and
   the second boundary line is disposed between about ⅕ and about ⅓ of a length of the rear surface member in another direction from another side of the rear surface member in a plan view.

5. The vapor chamber of claim 3, wherein an interval between the front surface member and the rear surface member at the first boundary line is substantially equal to an interval between the front surface member and the rear surface member at the second boundary line.

6. The vapor chamber of claim 3, wherein
   in the second area, an interval between the front surface member and the rear surface member gradually decreases as a distance from the first area increases, and
   in the third area, an interval between the front surface member and the rear surface member gradually decreases as a distance from the first area increases.

7. The vapor chamber of claim 1, wherein the wick is disposed on an inner side surface of the front surface member facing the rear surface member.

8. The vapor chamber of claim 1, wherein the rear surface member includes a plurality of recessed parts recessed toward the front surface member.

9. The vapor chamber of claim 8, wherein
   the rear surface member further includes:
      a first boundary line along which the second area is bent; and
      a second boundary line along which the third area is bent,
   the first boundary line is disposed between the first area and the second area,
   the second boundary line is disposed between the first area and the third area, and
   the plurality of recessed parts include:
      first recessed parts adjacent to the first boundary line and the second boundary line; and
      second recessed parts spaced apart from the first recessed parts.

10. The vapor chamber of claim 9, wherein a diameter of the first recessed parts is greater than a diameter of the second recessed parts.

11. The vapor chamber of claim 9, wherein an interval between the plurality of recessed parts gradually increases in an area between the first boundary line and a center of the rear surface member and decreases in an area between the second boundary line and the center of the rear surface member.

12. A display device comprising:

a display panel; and a vapor chamber disposed on a rear surface of the display panel, wherein the vapor chamber includes:

a front surface member in contact with the display panel and having a curvature, the front surface member being continuously curved;

a rear surface member coupled to the front surface member;

a wick disposed between the front surface member and the rear surface member; and a refrigerant at least partially filled between the front surface member and the rear surface member, and the rear surface member includes a plurality of bent areas, wherein the front surface member is convex toward the rear surface member, wherein the rear surface member comprises a first area, a second area bent from the first area, and a third area bent from the first area, wherein, the first area is disposed between the second area and the third area, and each of the first area, the second area, and the third area is formed as a flat surface, and wherein in the first area, an interval between the front surface member and the rear surface member gradually increases from a center of the first area toward the second area and from the center of the first area toward the third area.

13. The display device of claim 12, wherein the wick is disposed on an inner side surface of the front surface member facing the rear surface member.

14. The display device of claim 12, wherein the rear surface member includes a plurality of recessed parts recessed toward the front surface member.

15. The display device of claim 12, wherein the display panel has a curved surface following the curvature of the front surface member.

* * * * *